(12) United States Patent
Hsieh et al.

(10) Patent No.: US 12,164,034 B2
(45) Date of Patent: Dec. 10, 2024

(54) PIXEL ARRAY INCLUDING TIME-OF-FLIGHT SENSORS

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 221 days.

(21) Appl. No.: 17/249,969

(22) Filed: Mar. 19, 2021

(65) Prior Publication Data

US 2022/0299646 A1    Sep. 22, 2022

(51) Int. Cl.
  *G01S 17/894*  (2020.01)
  *H01L 27/146*  (2006.01)
(52) U.S. Cl.
  CPC ...... *G01S 17/894* (2020.01); *H01L 27/14636* (2013.01); *H01L 27/14643* (2013.01); *H01L 27/14689* (2013.01)

(58) Field of Classification Search
  CPC ............ G01S 17/894; H01L 27/14636; H01L 27/14643; H01L 27/14689
  See application file for complete search history.

(56) References Cited

U.S. PATENT DOCUMENTS

| | | | |
|---|---|---|---|
| 11,598,857 B2* | 3/2023 | Finkelstein | G01S 7/4863 |
| 2014/0002636 A1* | 1/2014 | Lee | G01C 3/08 |
| | | | 348/135 |
| 2017/0040362 A1 | 2/2017 | Na et al. | |
| 2018/0233528 A1 | 8/2018 | Na et al. | |
| 2018/0247968 A1* | 8/2018 | Na | H01L 29/161 |
| 2019/0252423 A1 | 8/2019 | Hsu et al. | |
| 2020/0105812 A1 | 4/2020 | Sze | |

* cited by examiner

*Primary Examiner* — Jay C Kim
*Assistant Examiner* — Oo K Lee
(74) *Attorney, Agent, or Firm* — Harrity & Harrity, LLP

(57) ABSTRACT

A pixel array may include a group of time-of-flight (ToF) sensors. The pixel array may include an image sensor comprising a group of pixel sensors. The image sensor may be arranged among the group of ToF sensors such that the image sensor is adjacent to each ToF sensor in the group of ToF sensors.

16 Claims, 26 Drawing Sheets

PIXEL ARRAY INCLUDING TIME-OF-FLIGHT SENSORS

BACKGROUND

Complementary metal oxide semiconductor (CMOS) image sensors utilize light-sensitive CMOS circuitry, referred to as pixel sensors, to convert light energy into electrical energy. A pixel sensor typically includes a photodiode formed in a silicon substrate. As the photodiode is exposed to light, an electrical charge is induced in the photodiode. The photodiode may be coupled to a switching transistor, which is used to sample the charge of the photodiode. Colors may be determined by placing color filters over photodiodes of a CMOS image sensor.

Time-of-Flight (ToF) sensors (e.g., sensors that use germanium-on-silicon (GeSi) technology to enable ToF sensing) can be used in a system designed to detect distances to objects in an area. Generally, a given ToF sensor detects a phase difference between a signal transmitted by the system and a corresponding signal received by the given ToF sensor (after reflection of the signal by an object in the area). This phase difference can be used to determine the distance to the object that reflected the signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
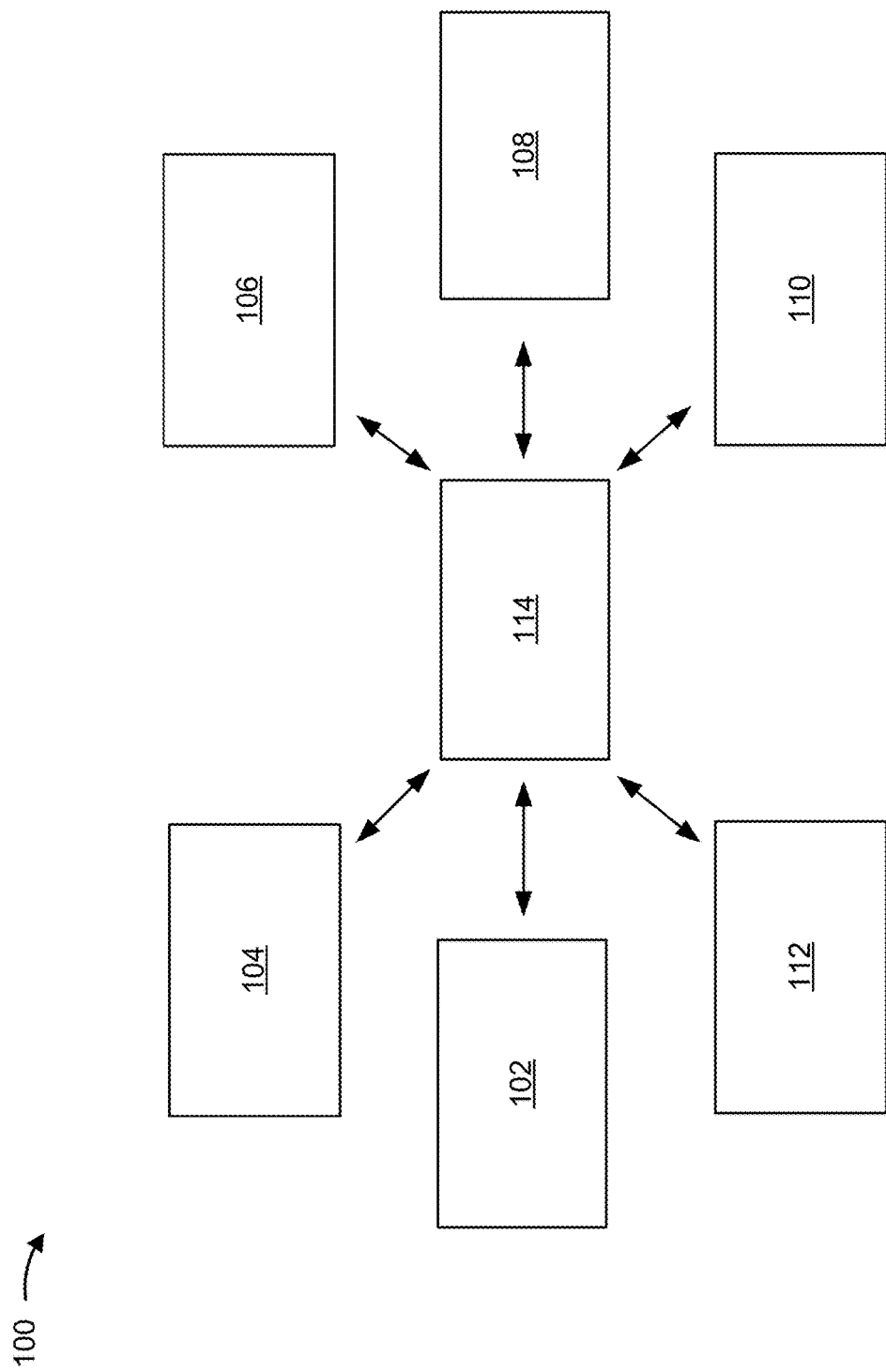
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, outputs from an array of ToF sensors can be used to generate a distance image (also referred to as a ToF image or a depth image) that indicates distances to objects in an area. However, while the distance image indicates distances to the objects in the area, the distance image does not provide a color image of the area. Further, outputs from an array of image sensors (e.g., an array of CMOS image sensors) can be used to generate a color image that indicates colors of objects in an area. However, while the color image indicates colors of the objects in the area, the color image does not provide a distance image of the area.

Some implementations described herein describe a pixel array that includes a plurality of ToF sensors and a plurality of image sensors (e.g., a plurality of CMOS image sensors, such as a plurality of red-green-blue (RGB) image sensors). In some implementations, outputs of the ToF sensors and outputs of the image sensors may be used to generate an image that indicates both distance to and color of objects in an area (herein referred to as a three-dimensional (3D) ToF color image). That is, the pixel array described herein enables distance information determined by ToF sensors and color information determined by image sensors to be combined to enable generation of a 3D ToF color image that indicates both distances to and colors of objects in an area.

A 3D ToF color image may be useful in, for example, 3D module construction, which can be used in a variety of applications, such as a medical application, a virtual reality (VR) application, an augmented reality (AR) application, a 3D printing application, or an autonomous vehicle application, among other examples.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, an ion implantation tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 112 is a semiconductor processing tool that is capable of implanting ions into a substrate. The ion implantation tool 112 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
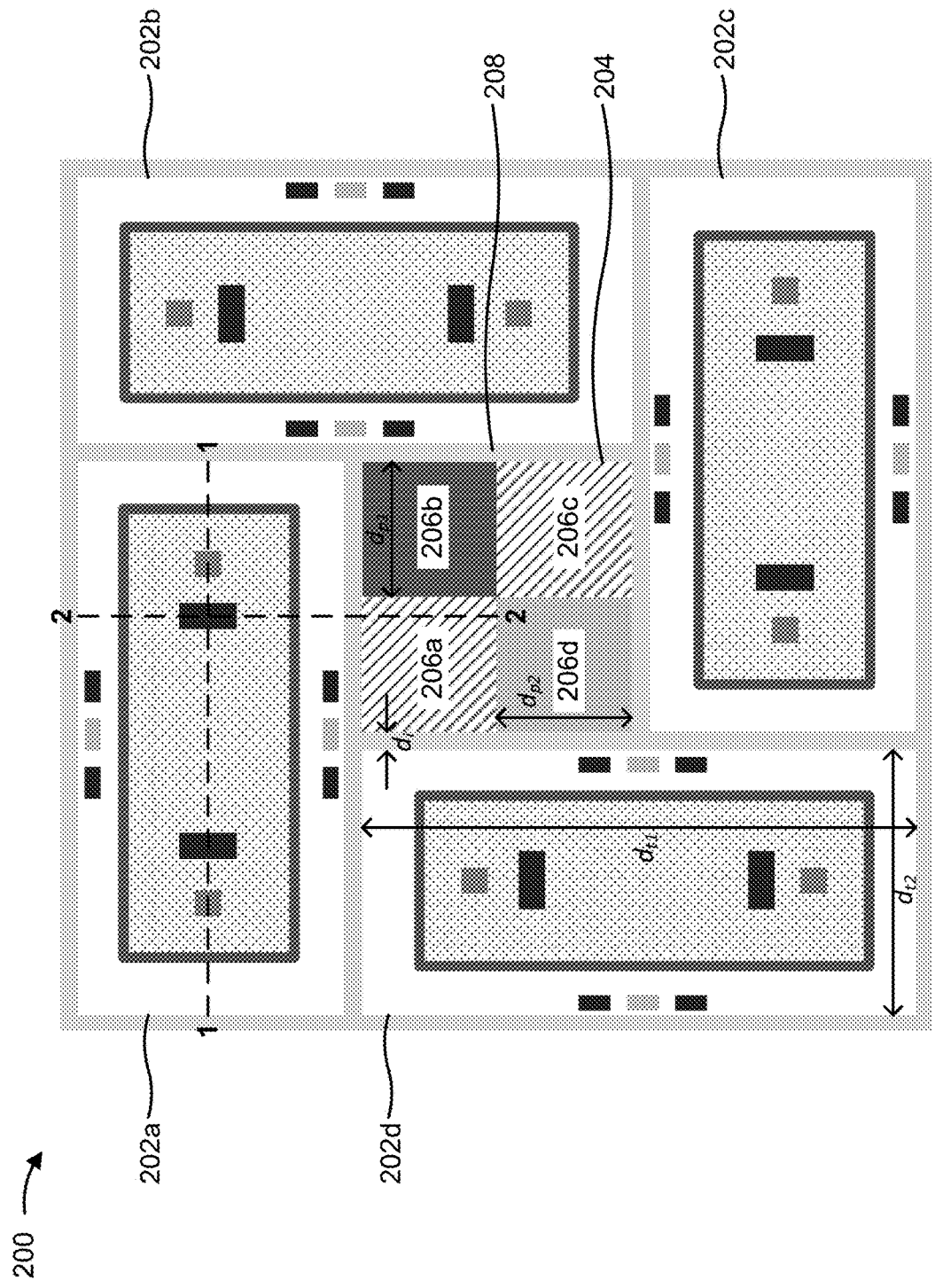
FIGS. 2A-2D are diagrams associated with example pixel arrays described herein.
Figure 2B:
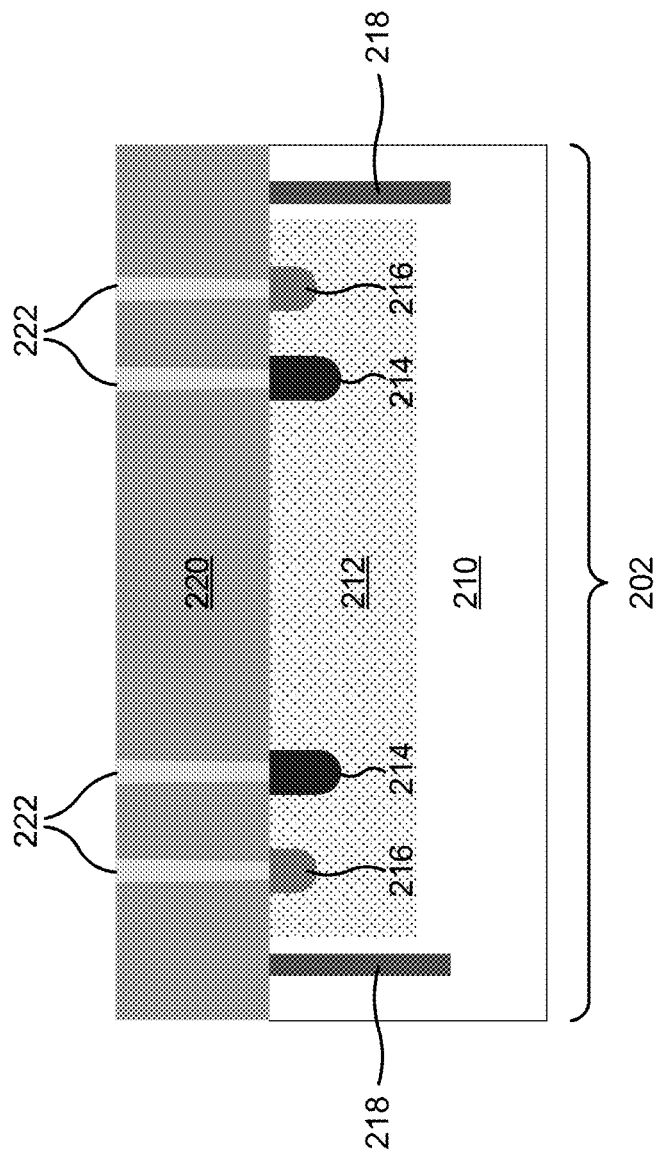
Figure 2C:
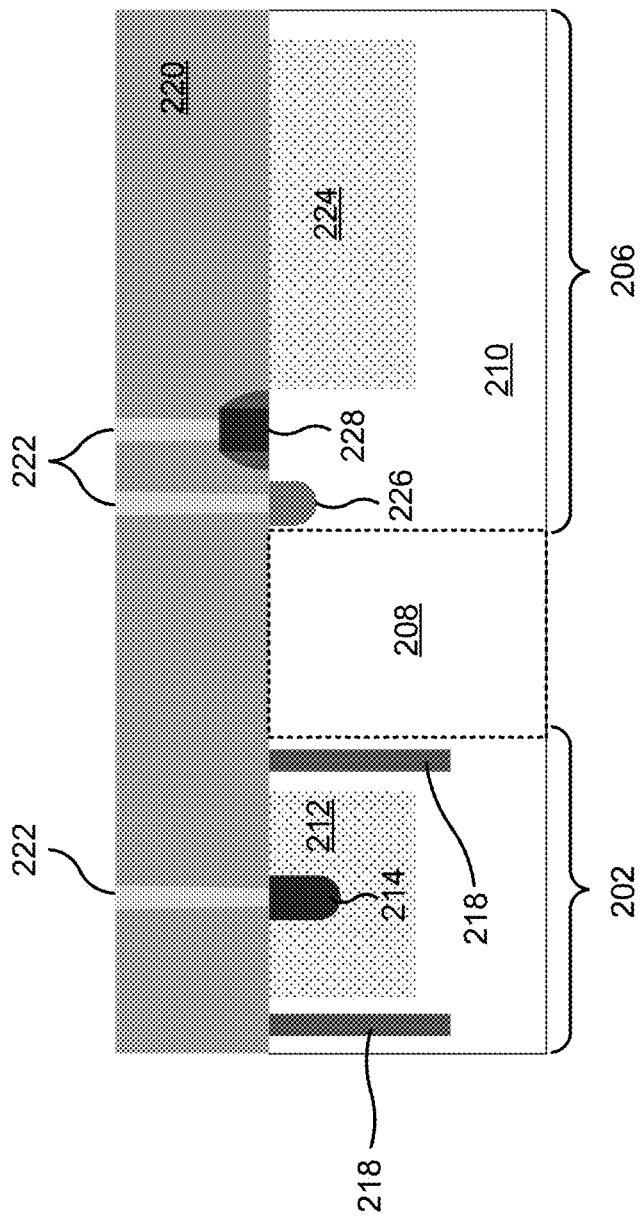

FIGS. 2A-2D are diagrams associated with an example pixel array 200 described herein. In some implementations, the pixel array 200 may be included in an imaging system configured to generate 3D ToF color images. FIG. 2A is a top view of a first example layout of the pixel array 200, and FIGS. 2B and 2C are cross-sectional views along the lines labeled 1 and 2 in FIG. 2A, respectively. As shown in FIG. 2A, the pixel array 200 may include a group of ToF sensors 202 (e.g., ToF sensors 202a through 202d) and an image sensor 204 comprising a group of pixel sensors 206 (e.g., pixel sensors 206a through 206d).

The ToF sensor 202 is a component capable of providing ToF sensing to determine distance information for a signal reflected to ToF sensor 202 (e.g., a signal transmitted by a transmission device associated with the pixel array 200 that is reflected back to the pixel array 200). In some implementations, the distance information determined by ToF sensor 202 indicates a distance to objects in an area in an environment of the ToF sensor 202. In some implementations, the distance information is determined by detecting a phase difference between the transmitted signal and the corresponding signal received by the ToF sensor 202 (after reflection of the signal by an object in the area). This phase difference can be used to determine the distance to the object that reflected the signal. In some implementations, the ToF sensor 202 may utilize germanium-on-silicon (GeSi) technology to enable ToF sensing. In some implementations, a GeSi ToF sensor 202 provides high quantum efficiency and a high demodulation contrast at a high operation frequency, thereby enabling improved depth accuracy when determining distance information. In the example of FIG. 2A, a size $d_{t1}$ of the ToF sensor 202 may be, for example, approximately 10 microns (μm) and a size $d_{t2}$ of the ToF sensor 202 may be, for example, approximately 6 μm. However, other sizes $d_{t1}$ and $d_{t2}$ of the ToF sensor 202 are within the scope of the present disclosure. In some implementations, a size of the ToF sensor 202 may be represented as a ratio of a length (e.g., $d_{t1}$) to a width (e.g., $d_{t2}$) of the ToF sensor 202, or length/width (e.g., $d_{t1}/d_{t2}$), such as 1.667. However, other ratios of the length to the width of the ToF sensor 202 are within the scope of the present disclosure.

The image sensor 204 is a component including a group of pixel sensors 206 to determine color information for incident light at the pixel array 200. In some implementations, image sensor 204 may be a CMOS image sensor. In some implementations, the group of pixel sensors 206 may include one or more red pixel sensors, one or more green pixel sensors, one or more blue pixel sensors, one or more yellow pixel sensors, one or more white pixel sensors, and/or one or more other types of pixel sensors configured to sense incident light in the visible light wavelength range. For example, in some implementations, the pixel sensors 206a and 206c may be green pixel sensors, the pixel sensor 206b may be a blue pixel sensor, and the pixel sensor 206d may be a red pixel sensor (e.g., such that the image sensor 204 is an RGGB sensor). In some implementations, a given pixel sensor 206 may be formed and/or configured to sense a wavelength of incident light associated with a particular color of visible light. For example, a red light pixel sensor may be a visible light pixel sensor that is formed and/or configured to sense a wavelength range of incident light corresponding to a red component of visible light (e.g., to provide red color information for the incident light), a green light pixel sensor may be a visible light pixel sensor that is formed and/or configured to sense a wavelength range of incident light corresponding to a green component of visible light (e.g., to provide green color information for the incident light), and a blue light pixel sensor may be a visible light pixel sensor that is formed and/or configured to sense a wavelength range of incident light corresponding to a blue component of visible light (e.g., to provide blue color information for the incident light). In some implementations, the pixel sensors 206 of the image sensor 204 in the pixel array 200 may be used to sense and obtain color information (e.g., color saturation information, color intensity information, color distribution information, and/or another type of color information) for incident light at the pixel array 200. In some implementations, sizes $d_{p1}$ and $d_{p2}$ of a given pixel sensor 206 may be, for example, in a range from approximately 1 μm to approximately 2.5 μm. However, other sizes $d_{p1}$ and $d_{p2}$ of a given pixel sensor 206 are within the scope of the present disclosure.

As shown in FIG. 2A, in some implementations, the image sensor 204 is arranged among the group of ToF sensors 202 such that the image sensor 204 is adjacent to each ToF sensor 202 in the group of ToF sensors 202. That is, the image sensor 204 may be arranged between the group of ToF sensors 202 in the pixel array 200. In some implementations, the image sensor 204 is separated from each ToF sensor 202 of the group of ToF sensors 202 by an isolation region 208. Similarly, in some implementations, each ToF sensor 202 of the group of ToF sensors 202 is separated from other ToF sensors 202 in the group of ToF sensors 202 by an isolation region 208. In some implementations, the isolation region 208 serves to reduce or prevent cross-talk between a given pair of sensors (e.g., between a pair of ToF sensors 202 or between a ToF sensor 202 and the image sensor 204), thereby improving performance of the pixel array 200 (e.g., in terms of saturation, accuracy, noise, contrast, brightness, hue and saturation, light sensitivity, or contour sharpness). In some implementations, a size $d_i$ of the isolation region 208 may be approximately 1 μm. In some implementations, the isolation region 208 having a size of approximately 1 μm provides adequate isolation without significantly impacting an overall size of the pixel array 200. However, other sizes $d_i$ of the isolation region 208 are within the scope of the present disclosure. Notably, isolation performance by the isolation region 208 versus an overall area of the pixel array 200 is a trade-off, meaning that isolation performance within the pixel array 200 can be balanced against an overall area of the pixel array 200, as desired. In general, the compact nature of the pixel array 200 reduces and/or minimizes unused gaps or portions between the ToF sensor 202 and the image sensor 204 in the pixel array 200, which increases the sensor density and increases spatial utilization.

In some implementations, the ToF sensors 202 surround the image sensor 204 such that the image sensor 204 is centered in the ToF sensors 202. For example, as shown in the first example layout of FIG. 2A, the group of ToF sensors 202 may surround the image sensor 204 such that the pixel array 200 forms a rectangular pattern (e.g., a square pattern). In such a case, to enable the formation of the rectangular pattern, a first set of ToF sensors 202 in the group of ToF sensors 202 may be oriented in a first direction and a second set of ToF sensors 202 in the group of ToF sensors 202 may be oriented in a second direction that is different from the first direction. Taking the first example layout shown in FIG. 2A as an example, ToF sensor 202a and ToF sensor 202c are oriented with respective lengths along a first direction (e.g., a horizontal direction in FIG. 2A), while ToF sensor 202b and ToF sensor 202d are oriented with respective lengths along a second direction (e.g., a vertical direction in FIG. 2A). In this example, ToF sensors 202a and 202c are oriented perpendicular relative to ToF sensors 202b and 202d. In some implementations, a rectangular pattern enabled by the differently oriented sets of ToF sensors 202 improves spatial utilization of a semiconductor die that includes pixel array 200. For example, the rectangular pattern of the first example layout enables multiple pixel arrays 200 (and/or multiple portions of pixel arrays 200 having the first example layout) to be arranged adjacent to one another to form a larger pixel array (e.g., a larger square pixel array) of a regular shape that can be readily integrated in a semiconductor device. Further, ToF sensors 202 being oriented in perpendicular subsets can enable sharing of a given ToF sensor 202 by pixel sensors 206 of two image sensors 204, as described below, thereby enabling an increased pixel area of an array of pixel arrays 200 having the first example layout.

FIGS. 2B and 2C are cross-sectional diagrams at the lines labeled 1-1 and 2-2 in FIG. 2A.

FIG. 2B is a cross-section along a length of a ToF sensor 202 (e.g., ToF sensor 202a). As shown in FIG. 2B, the ToF sensor 202 includes a photodiode 212 (e.g., including one or more germanium doped regions) formed in a substrate 210 (e.g., a silicon substrate), a set of p-type portions 214 (e.g., one or more p+ portions), a set of n-type portions 216 (e.g., one or more n+ portions), and isolation structures 218. As further shown in FIG. 2B, a layer 220 (e.g., including an oxide layer, a dielectric layer, or the like) with a set of contacts 222 (not shown in FIG. 2A) may be formed on the ToF sensor 202.

FIG. 2C is an example cross-section across a width of a ToF sensor 202 and across a pixel sensor 206 of the image sensor 204. As shown in FIG. 2C, photodiodes 224 of the pixel sensor 206 are formed in the substrate 210, the image sensor 204 further includes an n-type portion 226 (e.g., an n+ portion) and a gate 228. As further shown in FIG. 2C, the layer 220 and contacts 222 may be formed over the pixel sensor 206. As shown in FIG. 2C, the ToF sensor 202 may be separated from the image sensor 204 by an isolation region 208 in the substrate 210.

In some implementations, as described above, the ToF sensors 202 surround the image sensor 204 such that the image sensor 204 is centered in the ToF sensors 202. In some such cases, to enable the group of ToF sensors 202 to surround image sensor 204, ToF sensors 202 in the group of ToF sensors 202 may be oriented in the same direction (rather than in different directions, as described above). That is, in some implementations, each ToF sensor 202 in the group of ToF sensors 202 may be oriented parallel to each other ToF sensor 202 in the group of ToF sensors 202.

Figure 2D:
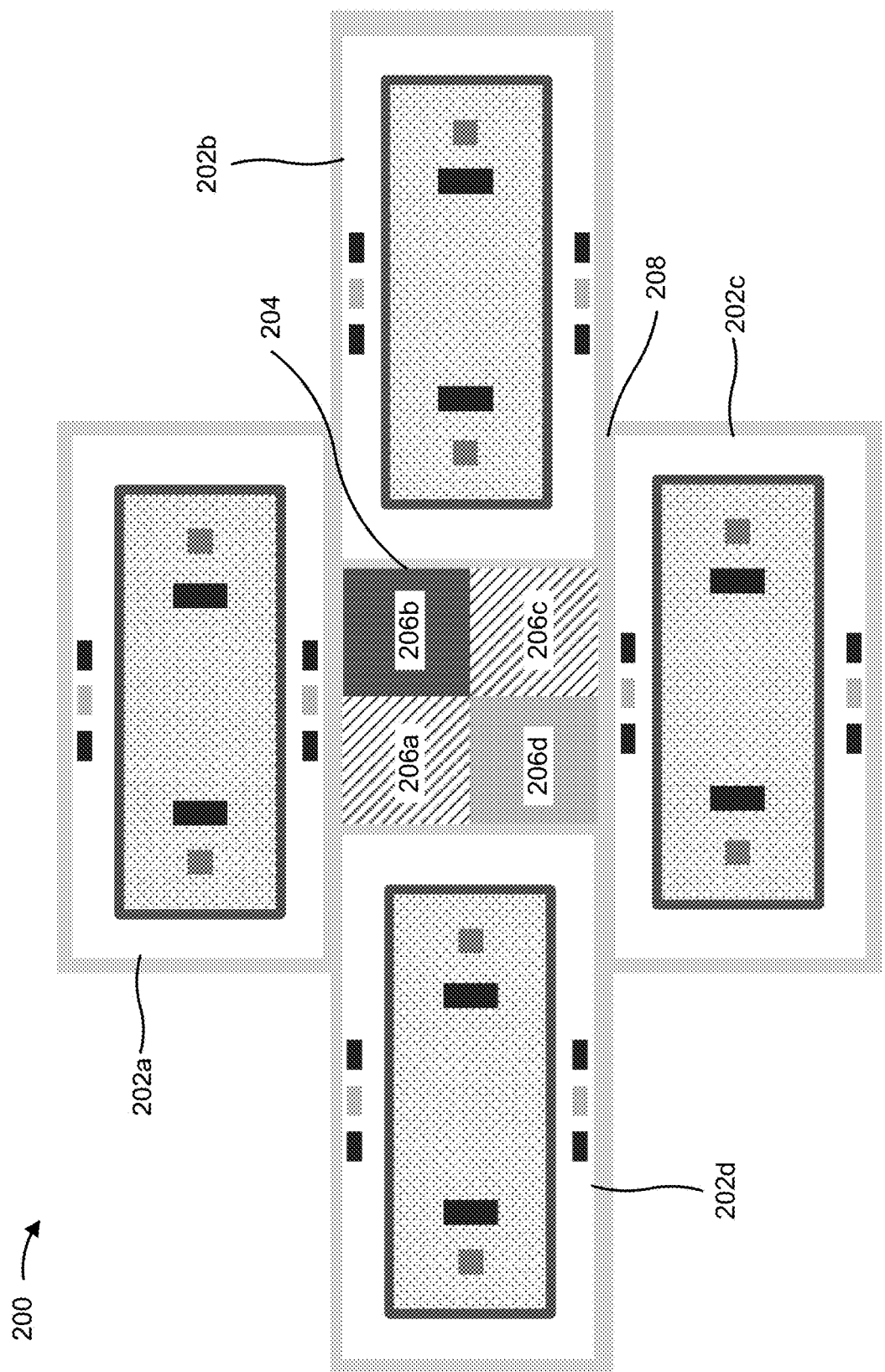

FIG. 2D is a top view of a second example layout of the pixel array 200 in which each ToF sensor 202 in the group of ToF sensors 202 is oriented parallel to each other ToF sensor 202 in the group of ToF sensors 202. As shown by the second example layout in FIG. 2D, ToF sensors 202a through 202d are oriented with respective lengths along a single direction (e.g., a vertical direction in FIG. 2D). In some implementations, a pattern enabled by the ToF sensors 202 being oriented in the same direction enables multiple pixel arrays 200 (and/or multiple portions of pixel arrays 200) having the second example layout to be arranged adjacent to one another to form a larger pixel array with a first overall dimension that is different from a second overall dimension (e.g., such that a rectangular array with non-equal dimensions is formed). For example, the pattern enabled by the second example layout may be used to form a rectangular array in which a length is greater than a width, which may be useful when, for example, a rectangular area is available on a semiconductor device for integration of the pixel array. Further, ToF sensors 202 being oriented in parallel to one another enables sharing of a given ToF sensor 202 by pixel sensors 206 of at least two image sensors 204 (e.g., four pixel sensors 206 of four different image sensors 204), as described below, thereby increasing pixel area of an array of pixel arrays 200 having the second example layout.

As indicated above, FIGS. 2A-2D are provided as examples. Other examples may differ from what is described with regard to FIGS. 2A-2D. Further, the ToF sensor 202 or the image sensor 204 shown in FIGS. 2A-2D may include additional elements, fewer elements, differently arranged elements, or elements having different relative sizes than those shown in FIGS. 2A-2D.

In some implementations, distance information determined by ToF sensors 202 and color information determined by pixel sensors 206 of an image sensor 204 may be used by an imaging system (e.g., by various components of the imaging system, such as one or more processors, transistors, memories, or other components) including the pixel array 200 to generate 3D ToF color information. For example, a particular ToF sensor 202 may be paired with a particular pixel sensor 206 of the image sensor 204 such that an output of the particular ToF sensor 202 is used in conjunction with an output of the particular pixel sensor 206. That is, the output of the particular ToF sensor 202 (e.g., a distance as measured by the particular ToF sensor 202) may be combined with or otherwise associated with the output of the particular pixel sensor 206 (e.g., an intensity of a particular color of visible light as measured by the particular pixel sensor 206) to create 3D ToF color information (e.g., information that identifies a distance and an intensity of the particular color of visible light) corresponding to a location of the particular pixel sensor 206. 3D ToF color information can be similarly generated for additional ToF sensor 202/ pixel sensor 206 pairings, and a 3D ToF color image can be generated from the 3D ToF color information determined across the array.

Figure 3A:
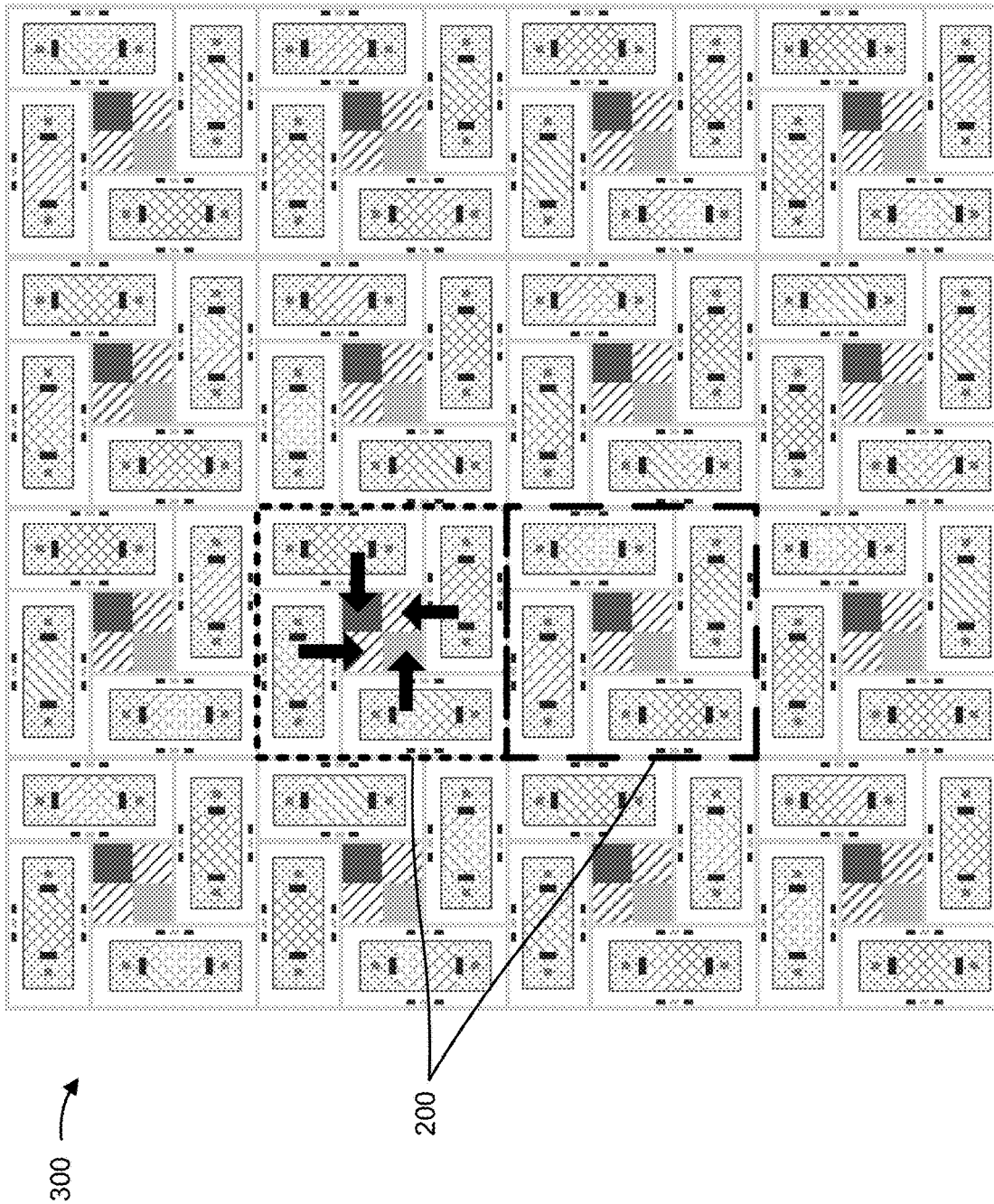
FIGS. 3A-3C are diagrams associated with example pixel arrays described herein.
Figure 3B:
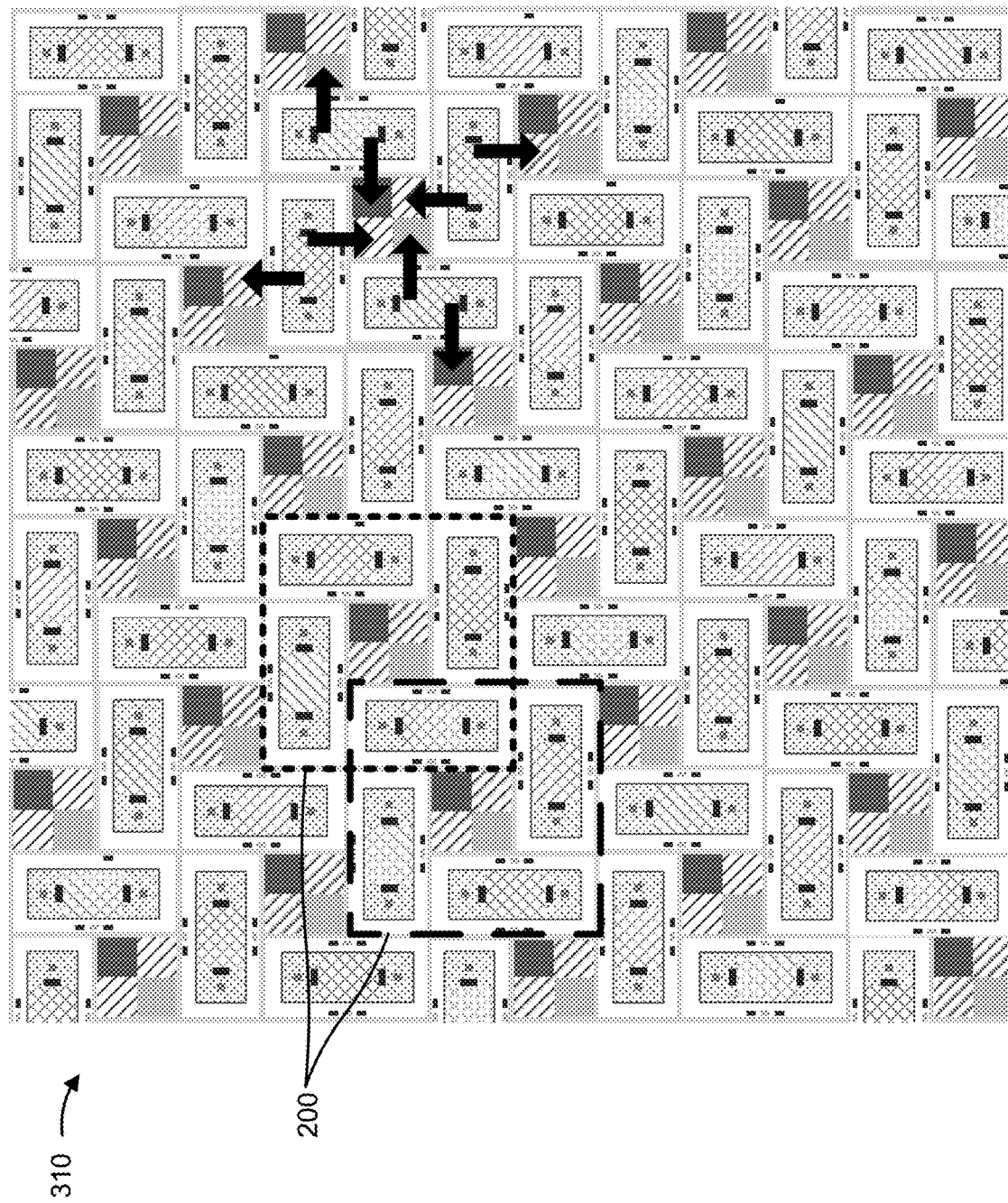
Figure 3C:
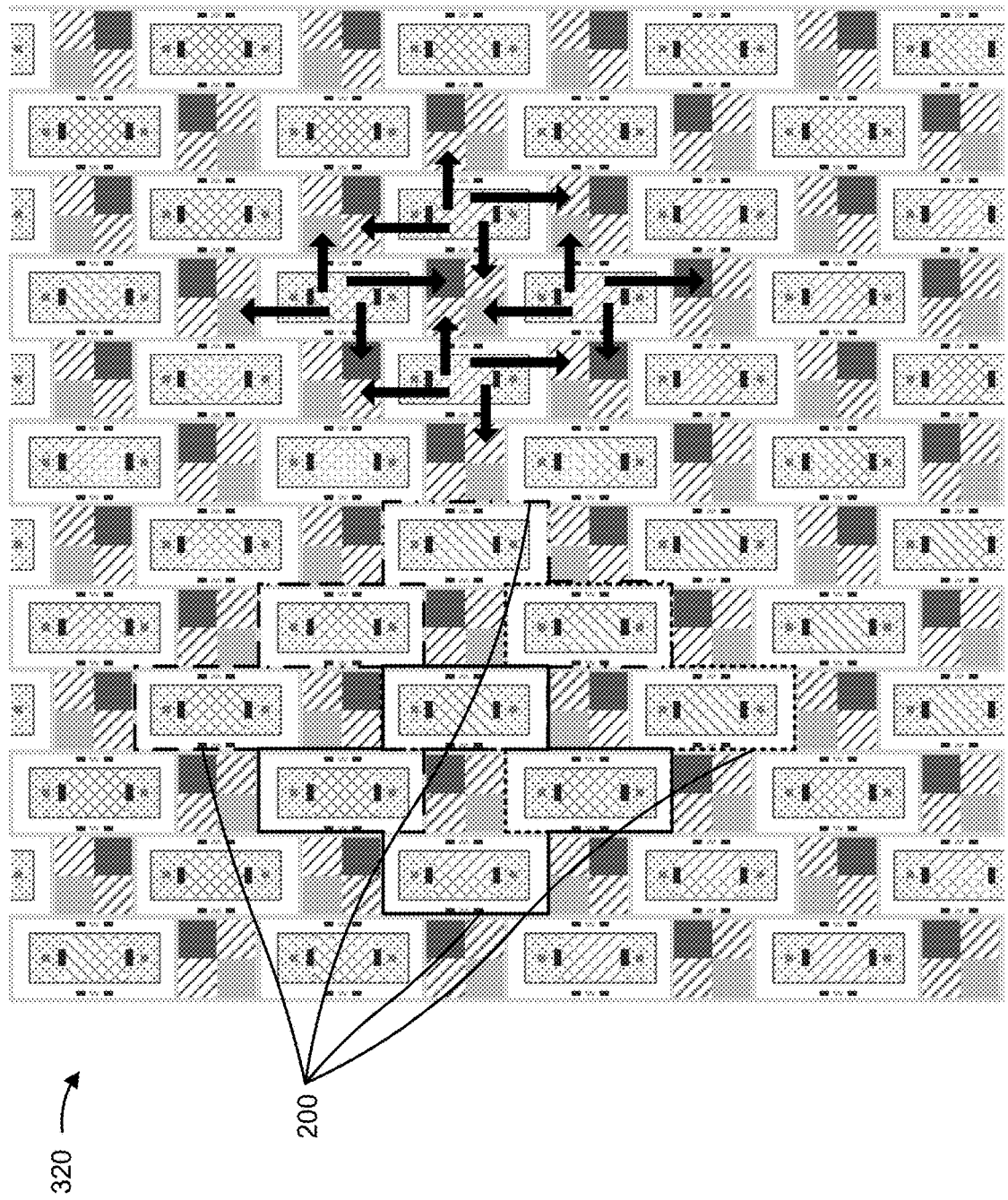

FIGS. 3A-3C are diagrams of example pixel arrays comprising multiple pixel arrays 200 that enable pairing of ToF sensors 202 and pixel sensors 206. FIG. 3A is a diagram of a top view of a portion of a pixel array 300 that includes multiple pixel arrays 200 having the first example layout shown in FIG. 2A. As shown in FIG. 3A, multiple pixel arrays 200 having the first example layout are arranged adjacent to one another to form the pixel array 300. As illustrated by the black arrows in FIG. 3A, a given ToF sensor 202 is paired with a single pixel sensor 206 in the pixel array 300. That is, in the pixel array 300, an output of a given ToF sensor 202 is to be used in conjunction with an output of only one pixel sensor 206 (e.g., such that each ToF sensor 202 is used in conjunction with a different pixel sensor 206). In some implementations, due to the pairing within the pixel array 300, a quantity of ToF sensors 202 is greater than a quantity of image sensors 204 in the pixel array 300 (e.g., the quantity of ToF sensors 202 is four times greater than the quantity of image sensor 204 when each image sensor 204 includes four pixel sensors 206). Put another way, the quantity of ToF sensors 202 in the pixel array 300 matches the quantity of pixel sensors 206 (e.g., when each image sensor 204 includes four pixel sensors 206). In some implementations, the pairing of a given ToF sensor 202 with a single pixel sensor 206 (enabled by the pixel array 300) improves performance of the pixel array 300 in terms of, for example, accuracy or contour sharpness in a 3D ToF image generated based on information collected by the pixel array 300 (e.g., as compared to a pixel array in which a given ToF sensor 202 is paired with multiple pixel sensors 206).

FIG. 3B is a diagram of a top view of a portion of a pixel array 310 that includes multiple pixel arrays 200 having the first example layout shown in FIG. 2A, where the pixel arrays 200 are arranged such that a ToF sensor 202 is included in two different pixel arrays 200. That is, in the pixel array 310, multiple pixel arrays 200 having the first example layout can be arranged to be partially overlapping such that a ToF sensor 202 is included in two different pixel arrays 200, as shown by the labeled pixel arrays 200 in FIG. 3B. As illustrated by the black arrows in FIG. 3B, a given ToF sensor 202 is paired with two pixel sensors 206 in the pixel array 310. Here, the output of the given ToF sensor 202 is to be used in conjunction with an output of a pixel sensor 206 in a first image sensor 204 and in conjunction with an output of a pixel sensor 206 in a second image sensor 204. Put another way, in the pixel array 310, an output of a given ToF sensor 202 is to be used in conjunction with an output of two pixel sensors 206 from different image sensors 204. In some implementations, the pairing within the pixel array 310 causes a quantity of ToF sensors 202 to be greater than a quantity of image sensors 204 in the pixel array 300 (e.g., the quantity of ToF sensors 202 is two times greater than the quantity of image sensors 204 when each image sensor 204 includes four pixel sensors 206). Put another way, the quantity of ToF sensors 202 in the pixel array 310 may be approximately one-half the quantity of pixel sensors 206 (e.g., when each image sensor 204 includes four pixel sensors 206). In some implementations, the pairing of a given ToF sensor 202 with two pixel sensors 206 (enabled by the pixel array 310) increases a pixel area of the pixel array 310 (e.g., as compared to the pixel array 300, which has twice as many ToF sensors 202 as the pixel array 310). Here, the increased pixel area can provide improved performance of the pixel array 310 in terms of, for example, color saturation, color accuracy, noise, contrast, brightness, hue and saturation, or light sensitivity, without significantly impacting performance of the pixel array 310 in terms of, for example, accuracy or contour sharpness.

FIG. 3C is a diagram of a top view of a portion of a pixel array 320 that includes multiple pixel arrays 200 having the second example layout shown in FIG. 2D, where the pixel arrays 200 are arranged such that a ToF sensor 202 is included in four different pixel arrays 200. That is, in the pixel array 320, multiple pixel arrays 200 having the second example layout can be arranged to be partially overlapping such that a ToF sensor 202 is included in four different pixel arrays 200, as shown by the labeled pixel arrays 200 in FIG. 3C, where the ToF sensor 202 at the center of the four labeled pixel arrays 200 having the second example layout is included in all four of the labeled pixel arrays 200. As illustrated by the black arrows in FIG. 3C, a given ToF sensor 202 is paired with four pixel sensors 206 in the pixel array 320. Here, the output of the given ToF sensor 202 is to be used in conjunction with an output of a pixel sensor 206 in a first image sensor 204, in conjunction with an output of a pixel sensor 206 in a second image sensor 204, in conjunction with an output of a pixel sensor 206 in a third image sensor 204, and in conjunction with an output of a pixel sensor 206 in a fourth image sensor 204. Put another way, in the pixel array 320, an output of a given ToF sensor 202 is to be used in conjunction with an output of four pixel sensors 206 from different image sensors 204. In some implementations, the pairing within the pixel array 320 causes a quantity of ToF sensors 202 to match (e.g., be equal to) a quantity of image sensors 204 in the pixel array 320 (e.g., the quantity of ToF sensors 202 is equal to the quantity of image sensors 204 when each image sensor 204 includes four pixel sensors 206). Put another way, the quantity of ToF sensors 202 in the pixel array 320 may be one quarter of the quantity of pixel sensors 206 (e.g., when each image sensor 204 includes four pixel sensors 206). In some implementations, the pairing of a given ToF sensor 202 with four pixel sensors 206 (enabled by the pixel array 320) increases a pixel area of the pixel array 320 (e.g., as compared to the pixel array 300 which has four times as many ToF sensors 202 as the pixel array 320). Here, the increased pixel area can provide further improved performance of the pixel array 320 in terms of, for example, color saturation, color accuracy, noise, contrast, brightness, hue and saturation, or light sensitivity. Notably, accuracy or contour sharpness of a 3D ToF image may decreased by the sharing of a single ToF sensor 202 with four pixel sensors 206 (e.g., as compared to one-to-one pairing of ToF sensors 202 and pixel sensors 206).

As indicated above, FIGS. 3A-3C are provided as examples. Other examples may differ from what is described with regard to FIGS. 3A-3C.

Figure 4:
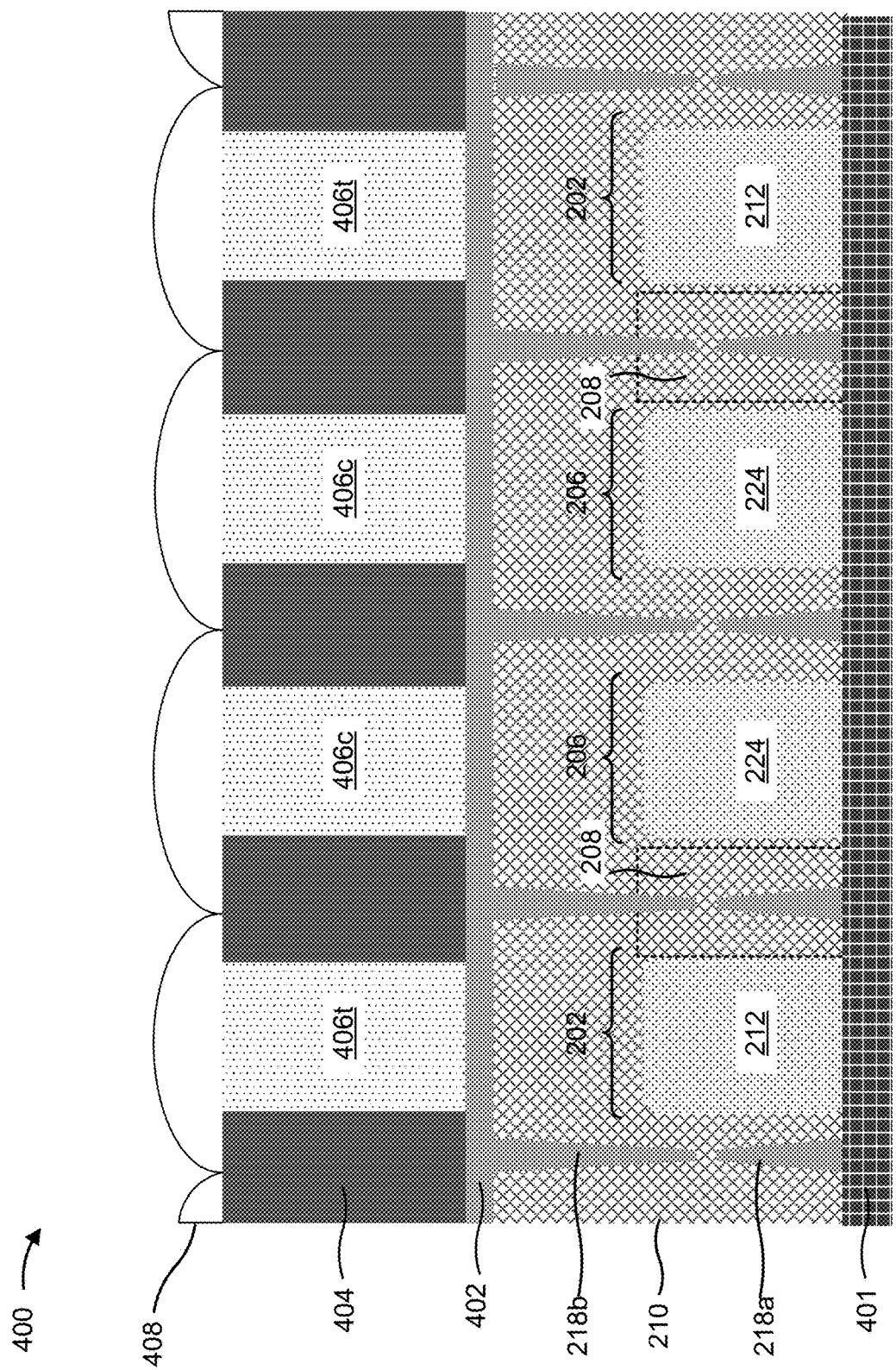
FIG. 4 is a diagram of an example pixel array described herein.

FIG. 4 is a diagram of an example pixel array 400 described herein. In some implementations, the example pixel array 400 illustrated in FIG. 4 may include, or may be included in, the pixel array 200, the pixel array 300, the pixel array 310, the pixel array 320, or a portion of any of the pixel arrays described herein. Further, the example pixel array 400 is shown for illustrative purpose, and the pixel array 400 can be adjusted to match the pixel array 200, the pixel array 300, the pixel array 310, the pixel array 320, or a portion of any of the pixel arrays described herein.

As shown in FIG. 4, the pixel array 400 may include a set of ToF sensors 202 and a set of pixel sensors 206 of an image sensor 204. In some implementations, the ToF sensors 202 and the pixel sensors 206 are configured in the example layout for the pixel array 200 shown in FIG. 2A or FIG. 2D.

The ToF sensors 202 and the pixel sensors 206 may be formed in a substrate 210, which may include a semiconductor die substrate, a semiconductor wafer, or another type of substrate in which semiconductor pixels may be formed. In some implementations, the substrate 210 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each ToF sensor 202 may include a photodiode 212. A photodiode 212 may include a region of the substrate 210 that is doped with a plurality of types of ions to form a p-n junction or a PIN junction (e.g., a junction between a p-type portion, an intrinsic (or undoped) type portion, and an n-type portion) for use in ToF sensing. For example, the substrate 210 may be doped with an n-type dopant to form a first portion (e.g., an n-type portion) of a photodiode 212 and a p-type dopant to form a second portion (e.g., a p-type portion) of the photodiode 212. In some implementations, the photodiode 212 includes one or more germanium doped regions. A photodiode 212 may be configured to absorb photons of incident light, such as infrared light, near-infrared light, light of approximately 1550 nanometers (nm), or the like. The absorption of photons causes a photodiode 212 to accumulate a charge (referred to as a photocurrent) due to the photoelectric effect. Here, photons bombard the photodiode 212, which causes emission of electrons of the photodiode 212. The emission of electrons causes the formation of electron-hole pairs, where the electrons migrate toward the cathode of the photodiode 212 and the holes migrate toward the anode, which produces the photocurrent.

Each pixel sensor 206 may include a photodiode 224. A photodiode 224 may include a region of the substrate 210 that is doped with a plurality of types of ions to form a p-n junction or a PIN junction (e.g., a junction between a p-type portion, an intrinsic (or undoped) type portion, and an n-type portion). For example, the substrate 210 may be doped with an n-type dopant to form a first portion (e.g., an n-type portion) of a photodiode 224 and a p-type dopant to form a second portion (e.g., a p-type portion) of the photodiode 224. A photodiode 224 may be configured to absorb photons of incident light, such as visible light (e.g., red light, green light, blue light, or light having a wavelength of less than approximately 800 nm, among other examples). The absorption of photons causes a photodiode 224 to accumulate a charge (referred to as a photocurrent) due to the photoelectric effect. Here, photons bombard the photodiode 224, which causes emission of electrons of the photodiode 224. The emission of electrons causes the formation of electron-hole pairs, where the electrons migrate toward the cathode of the photodiode 224 and the holes migrate toward the anode, which produces the photocurrent.

An isolation structure 218 (shown as including isolation structure 218a and isolation structure 218b) may be included in the substrate 210 between adjacent elements of the pixel array 400 (e.g., adjacent ToF sensors 202, adjacent pixel sensors 206, and/or between a ToF sensor 202 and a pixel sensor 206). The isolation structure 218 may provide optical isolation by blocking or preventing diffusion or bleeding of light from one ToF sensor 202/pixel sensor 206 to another ToF sensor 202/pixel sensor 206, thereby reducing crosstalk between adjacent elements of the pixel array 400. The isolation structure 218 may include trenches or deep trench isolation (DTI) structures filled with, for example, an oxide material. In some implementations, the isolation structure 218 may be formed in a grid layout in which the isolation structure 218 extends around the perimeters of the ToF sensors 202 and/or the pixel sensors 206 in the pixel array 400 and intersects at various locations of the pixel array 400. In some implementations, a portion of the isolation structure 218 (e.g., isolation structure 212a) is formed in the isolation region 208 of the substrate 210 or is formed adjacent to the isolation region 208.

The routing structure 401 is a structure associated with interconnecting the devices of the pixel array 400 (e.g., the ToF sensors 202 and the pixel sensors 206 of the image sensor 204) with wiring (e.g., a metallization layer, not shown in FIG. 4). In some implementations, the routing structure 401 may include one or more dielectric layers, one or more metal layers, one or more contacts, one or more vias, or one or more passivation layers, among other examples. In some implementations, the routing structure 401 is formed using a back end of line (BEOL) process. Notably, particular details of the features of the routing structure 401 are not shown or described with specificity.

The oxide layer 402 may function as a dielectric buffer layer between the photodiodes 212 and the photodiodes 224 and the layers above the photodiodes 212 and the photodiodes 224. The oxide layer 402 may include an oxide material such as a silicon oxide ($SiO_x$) (e.g., silicon dioxide ($SiO_2$)), a hafnium oxide ($HfO_x$), a tantalum oxide ($TaO_x$), an aluminum oxide ($AlO_x$), or another type of dielectric oxide material. In some implementations, another type of dielectric material is used in place of the oxide layer 402, such as a silicon nitride ($Si_xN_y$), a silicon carbide ($SiC_x$), a titanium nitride ($TiN_x$), or a tantalum nitride ($TaN_x$).

A grid structure 404 may be included over and/or on the oxide layer 402. The grid structure 404 may include a plurality of interconnected columns formed from a plurality of layers that are etched to form the columns. The grid structure 404 may surround the perimeters of the ToF sensors 202 and/or the pixel sensors 206 and may be configured to provide additional crosstalk reduction and/or mitigation in combination with the isolation structure 218.

In some implementations, the sidewalls of the grid structure 404 are substantially straight and parallel (e.g., the sidewalls are at an approximately 90 degree angle relative to a top surface of the grid structure 404). In some implementations, the sidewalls of the grid structure 404 are angled or tapered. In these examples, the sidewalls may taper between the top and the bottom of the grid structure 404 at an angle (e.g., at a non-90-degree angle, such as at an angle that is greater than approximately 90 degrees and less than or equal to approximately 120 degrees) relative to the top surface of the grid structure 404 such that the bottom of the grid structure 404 is wider relative to the top of the grid structure 404. For example, in some implementations, the sidewalls may taper between the top and the bottom of the grid structure 404 at a non-90-degree angle, such as at an angle that is greater than approximately 90 degrees and less than or equal to approximately 120 degrees, relative to the top surface of the grid structure 404. However, other angles of the sidewalls relative to the top surface of the grid structure 404 are within the scope of the present disclosure. In some implementations, the particular angle of the sidewalls may be based on an amount of incident light that the grid structure 404 is to block (e.g., a greater angle may block a lesser amount of light relative to a smaller angle). The grid structure 404 may include a plurality of layers over and/or on the oxide layer 402. The grid structure 404 may include one or more metal layers (or metal-containing layers) and one or more dielectric layers, and may be referred to as a composite metal grid (CMG).

Respective color filter regions 406 may be included in the areas between the grid structure 404. For example, color filter regions 406c may be formed in between columns of the grid structure 404 over photodiodes 224 of the pixel sensors 206, and color filter regions 406t may be formed in between columns of the grid structure 404 over the ToF sensors 202. Alternatively, the areas between the grid structure 404 may be completely filled with a passivation layer, and a color filter layer including the color filter regions 406 may be formed above the grid structure 404 on the passivation layer.

Each color filter region 406 may be configured to filter incident light to allow a particular wavelength of the incident light (or all wavelengths of incident light) to pass. For example, the color filter region 406c included in the left pixel sensor 206 of the pixel array 400 may filter red light for the left pixel sensor 206 (and thus, the left pixel sensor 206 may be a red pixel sensor) and the color filter region 406c included in the right pixel sensor 206 may filter green light for the right pixel sensor 206 (and thus, the right pixel sensor 206 may be a green pixel sensor), and so on. Here, the color filter regions 406t included in the ToF sensors 202 of the pixel array 400 may be non-discriminating or non-filtering, meaning that all wavelengths of light are allowed to pass through the color filter region 406t included in the ToF sensors 202 (e.g., for purposes of performing ToF sensing).

A micro-lens layer 408 may be included above and/or on the color filter regions 406. The micro-lens layer 408 may include a respective micro-lens for each of the pixel sensors 206. For example, a micro-lens may be formed to focus incident light toward a photodiode 212 of a given ToF sensor 202, while another micro-lens may be formed to focus incident light toward a photodiode 224 of a given pixel sensor 206, and so on.

As indicated above, FIG. 4 is provided as an example. Other examples may differ from what is described with regard to FIG. 4.

FIGS. 5A-5L are diagrams of an example implementation described herein. The example implementation may be an example process or method for forming the pixel array 400. In some implementations, the various example techniques and procedures described in connection with FIGS. 5A-5L may be used in connection with other pixel arrays described herein, such as the pixel array 200 described in connection with FIG. 2A, the pixel array 200 described in connection with FIG. 2D, the pixel array 300 described in connection with FIG. 3A, the pixel array 310 described in connection with FIG. 3B, and/or the pixel array 320 described in connection with FIG. 3C.

Figure 5A:
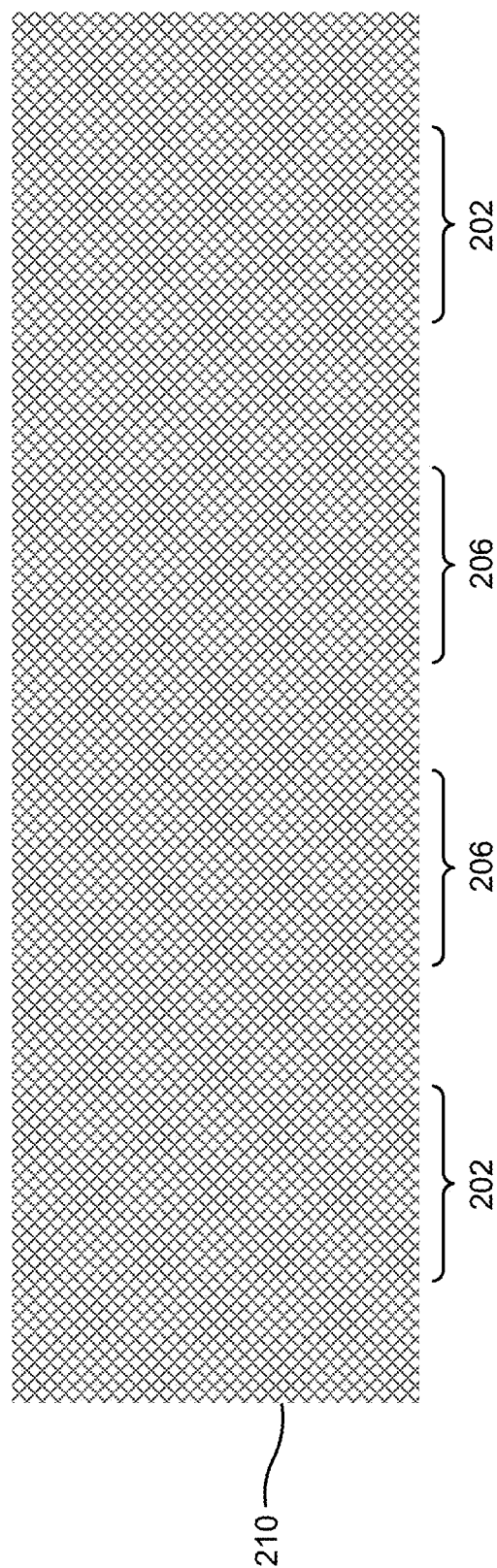
FIGS. 5A-5L are diagrams of an example implementation described herein.

As shown in FIG. 5A, the ToF sensors 202 and the pixel sensors 206 may be formed in the substrate 210. The substrate 210 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

Figure 5B:
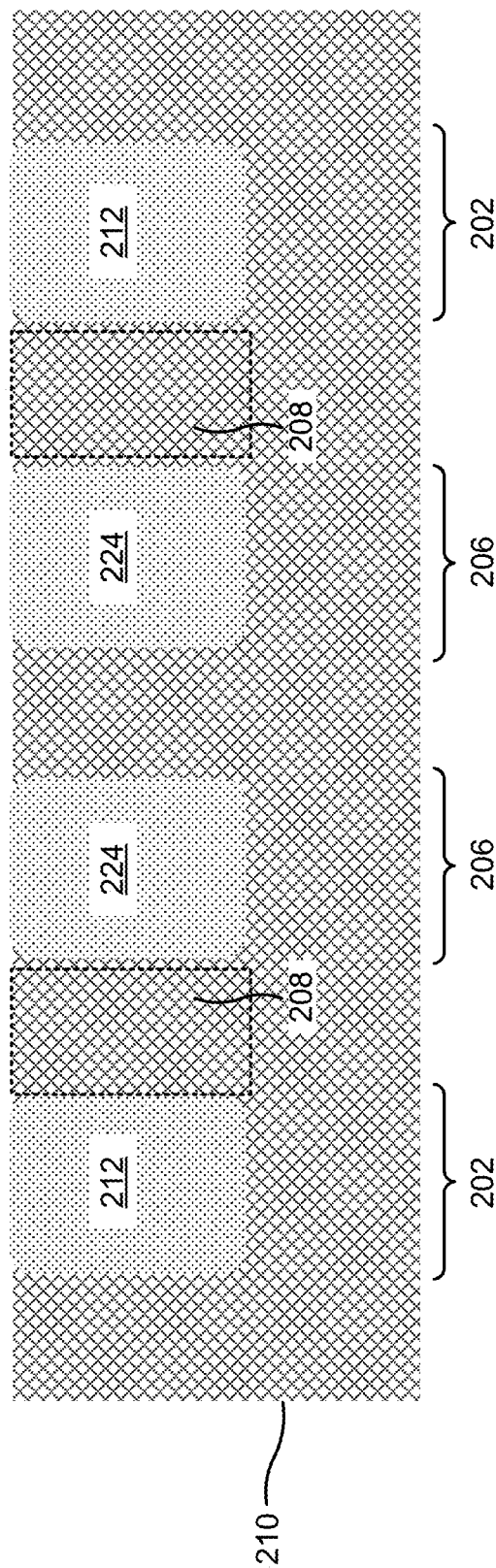

As shown in FIG. 5B, one or more semiconductor processing tools may form a plurality of photodiodes 212 and a plurality of photodiodes 224 in the substrate 210. For example, the ion implantation tool 112 may dope the portions of the substrate 210 using an ion implantation technique to form respective photodiodes 212 for a plurality of ToF sensors 202 and photodiodes 224 for a plurality of pixel sensors 206. The substrate 210 may be doped with a plurality of types of ions to form each photodiode 212 and each photodiode 224.

Figure 5C:
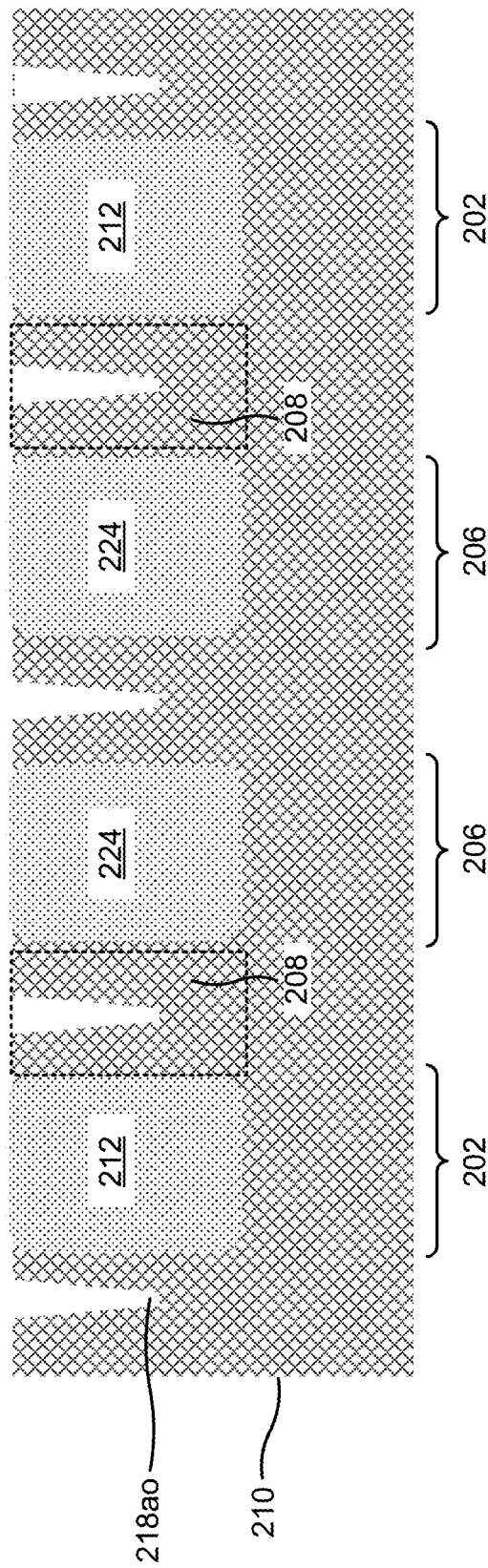

As shown in FIG. 5C, openings 218ao may be formed in the substrate 210 in association with forming an isolation structure 218a (e.g., a shallow trench isolation (STI) structure) in the substrate 210. In particular, the openings 218ao may be formed such that the isolation structure 218a may be formed between photodiodes 212, between photodiodes 224, and between photodiodes 212 and photodiodes 224 of the pixel array 400. In some implementations, one or more semiconductor processing tools may be used to form the one or more openings 218ao in the substrate 210. For example, the deposition tool 102 may form a photoresist layer on the substrate 210, the exposure tool 104 may expose the photoresist layer to a radiation source to pattern the photoresist layer, the developer tool 106 may develop and remove portions of the photoresist layer to expose the pattern, and the etch tool 108 may etch portions of substrate 210 to form the openings 218ao in the substrate 210. In some implementations, a photoresist removal tool removes the remaining portions of the photoresist layer (e.g., using a chemical stripper and/or another technique) after the etch tool 108 etches the substrate 210.

Figure 5D:
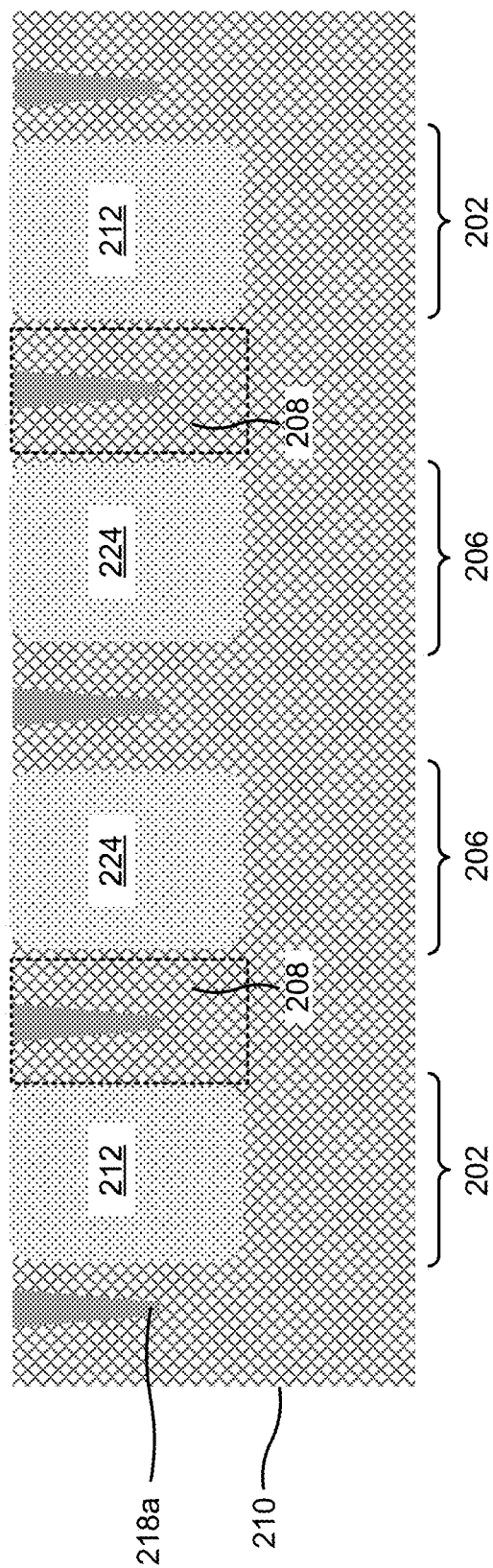

As shown in FIG. 5D, the openings 218ao may be filled with an oxide material to form isolation structure 218a. In particular, a semiconductor processing tool (e.g., the deposition tool 102) may deposit an oxide material (e.g., a silicon oxide ($SiO_x$), a tantalum oxide ($Ta_xO_y$), or another type of oxide) such that the oxide material is formed in and on the openings 218ao. The semiconductor processing tool may deposit the oxide material using various PVD techniques, CVD techniques and/or ALD techniques, such as sputtering, PECVD, HDP-CVD, SACVD, or PEALD.

Figure 5E:
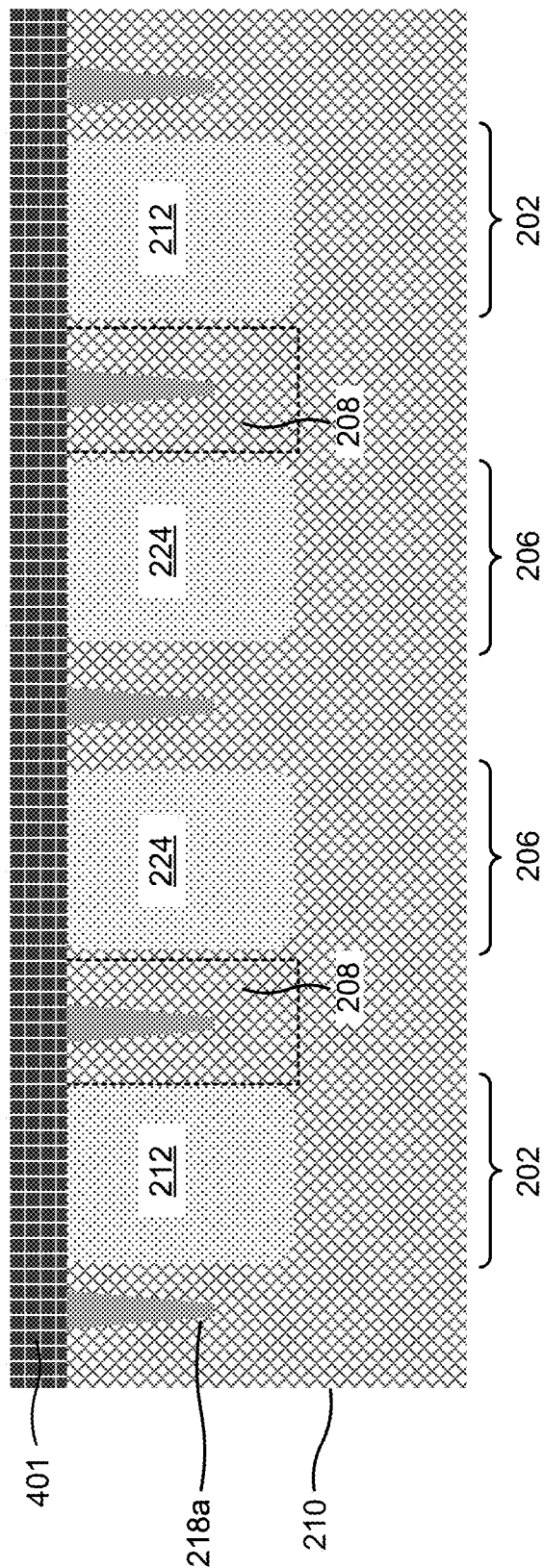

As shown in FIG. 5E, a routing structure 401 may be formed on the pixel array 400 (e.g., on the ToF sensors 202 and the pixel sensors 206) and the isolation structure 218a. For example, one or more of semiconductor processing tools (e.g., the deposition tool 102, the exposure tool 104, the developer tool 106, the etch tool 108, the planarization tool 110, or the like) may perform a BEOL process that forms the routing structure 401 on the pixel array 400 and the isolation structure 218a.

Figure 5F:
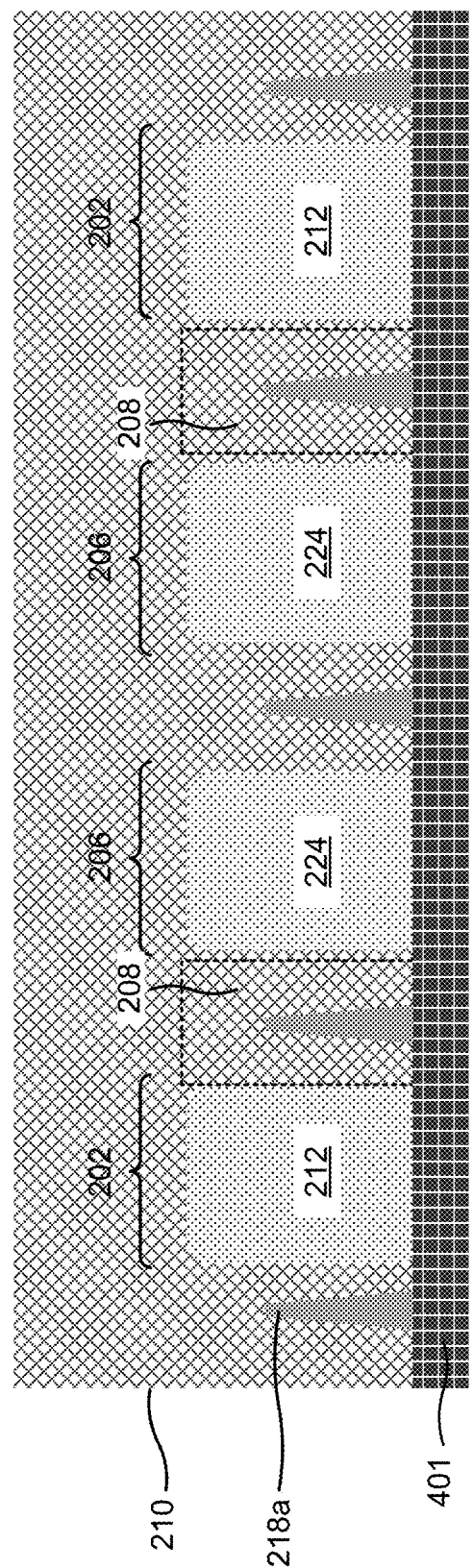

As shown in FIG. 5F, the pixel array 400 may be flipped for further processing. In some implementations, the pixel array 400 may be affixed to a carrier wafer (e.g., using an adhesive such as a tape or a glue, among other examples) prior to being flipped. In some implementations, after the pixel array 400 is affixed to the carrier wafer and is flipped, the substrate 210 may be thinned in order to remove a portion of the substrate 210 from the back side of the pixel array 400. For example, the planarization tool 110 may perform a wafer thinning process to remove a portion of the substrate 210 from the back side of the pixel array 400. In some implementations, the planarization tool 110 may grind the substrate 210 to thin the substrate 210 on the back side of the pixel array 400 after the pixel array 400 is affixed to the carrier wafer.

Figure 5G:
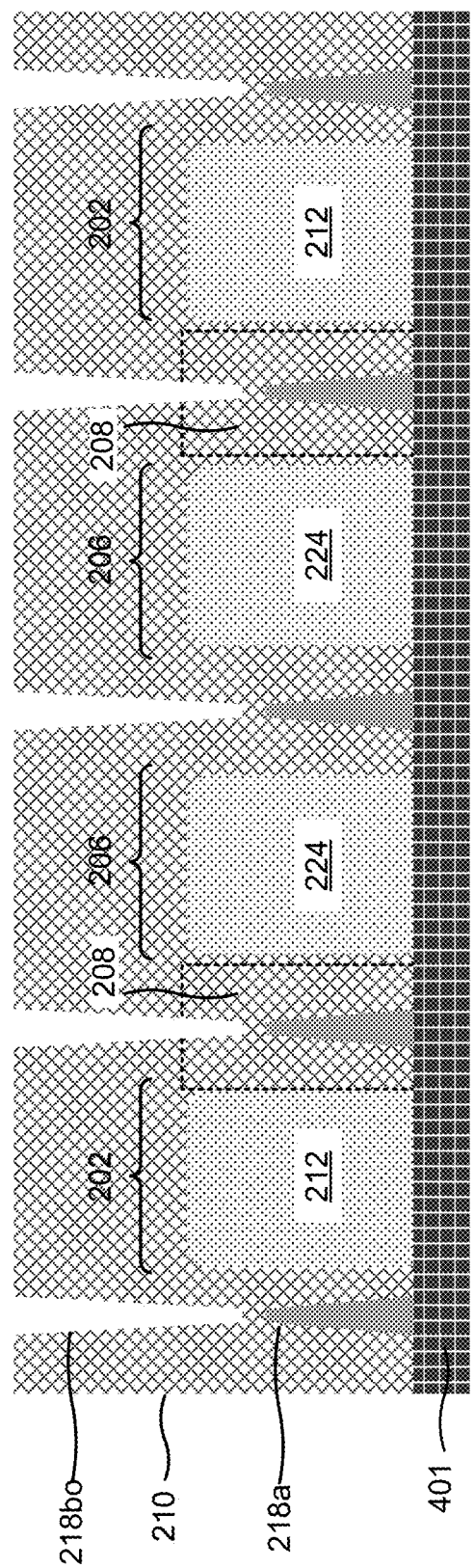

As shown in FIG. 5G, openings 218bo may be formed in the substrate 210 in association with forming an isolation structure 218b (e.g., a DTI structure) in the substrate 210. In particular, the openings 218bo may be formed such that (at least some portion of) the isolation structure 218b may be formed between photodiodes 212, between photodiodes 224, and between photodiodes 212 and photodiodes 224 of the pixel array 400. In some implementations, one or more semiconductor processing tools may be used to form the one or more openings 218bo in the substrate 210. For example, the deposition tool 102 may form a photoresist layer on the substrate 210, the exposure tool 104 may expose the photoresist layer to a radiation source to pattern the photoresist layer, the developer tool 106 may develop and remove portions of the photoresist layer to expose the pattern, and the etch tool 108 may etch portions of substrate 210 to form the openings 218bo in the substrate 210. In some implementations, a photoresist removal tool removes the remaining portions of the photoresist layer (e.g., using a chemical stripper and/or another technique) after the etch tool 108 etches the substrate 210.

Figure 5H:
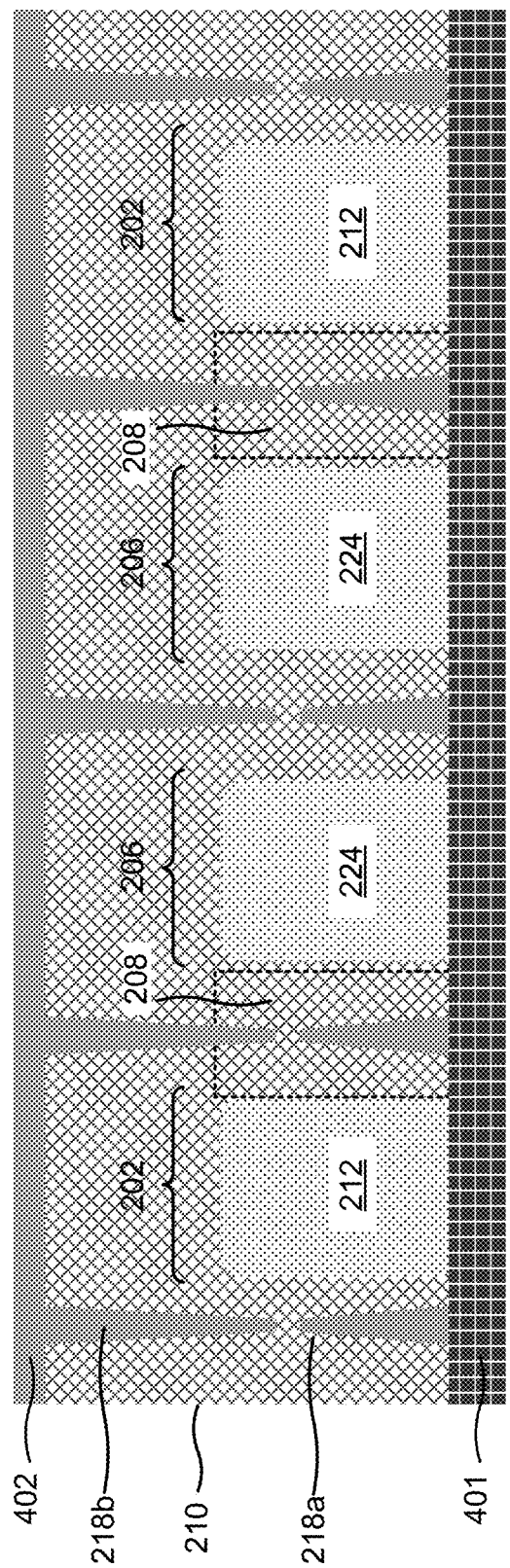

As shown in FIG. 5H, the openings 218bo may be filled with an oxide material to form isolation structure 218b and the oxide layer 402. In particular, a semiconductor processing tool (e.g., the deposition tool 102) may deposit the oxide layer 402 (e.g., a silicon oxide ($SiO_x$), a tantalum oxide ($Ta_xO_y$), or another type of oxide) such that the oxide layer 402 is formed in and on the isolation structure 218b. The semiconductor processing tool may deposit the oxide layer 402 using various PVD techniques, CVD techniques and/or ALD techniques, such as sputtering, PECVD, HDP-CVD, SACVD, or PEALD.

Figure 5I:
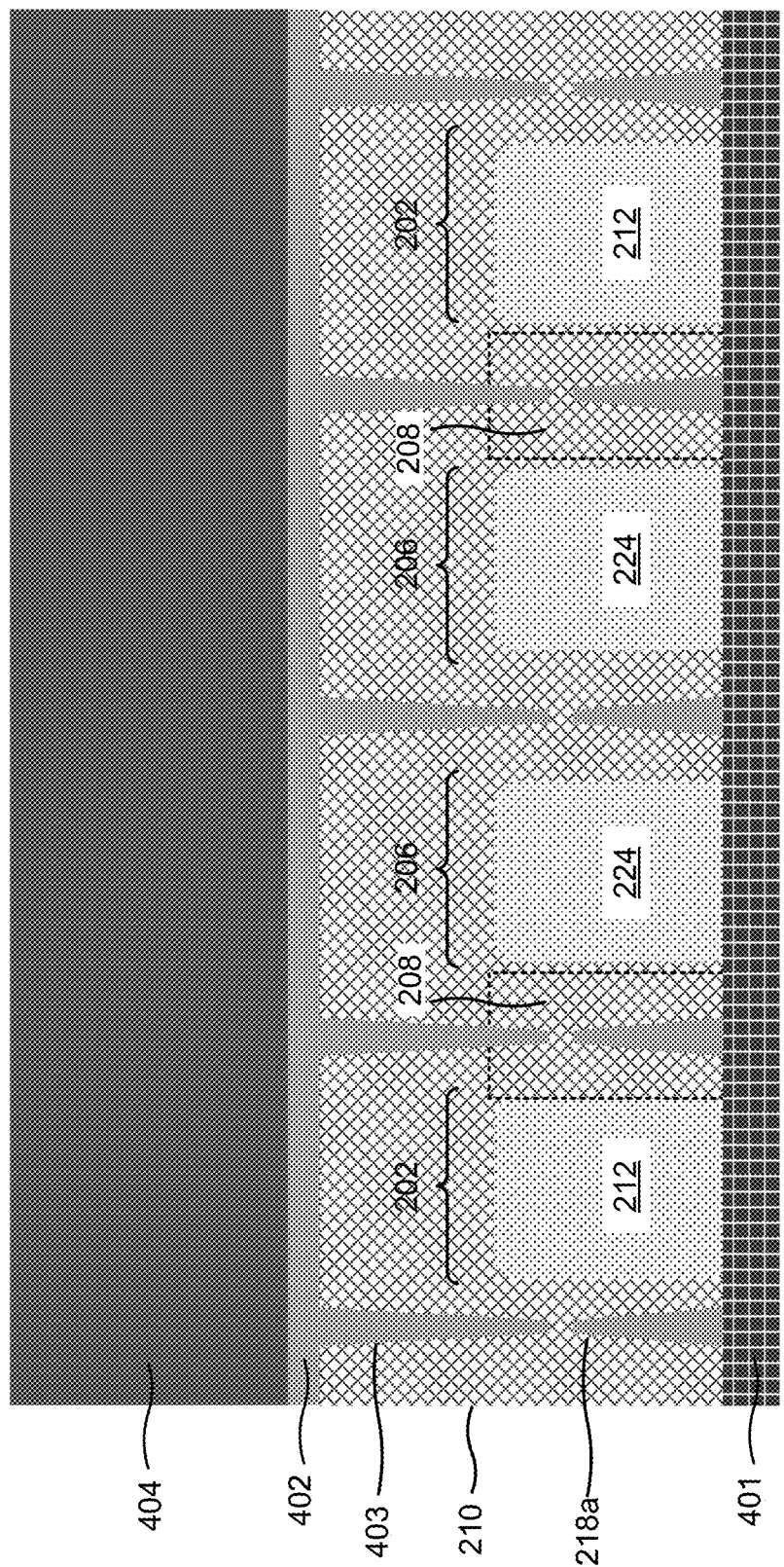

As shown in FIG. 5I, one or more layers may be formed over and/or on the oxide layer 402 as part of forming the grid structure 404. For example, the deposition tool 102 may deposit the one or more layers (e.g., one or more metal layers and/or one or more dielectric layers) to form the layer from which the grid structure 404 will be formed. The deposition tool 102 may deposit the one or more layers using various PVD techniques, CVD techniques and/or ALD techniques, such as sputtering, PECVD, HDP-CVD, SACVD, or PEALD.

Figure 5J:
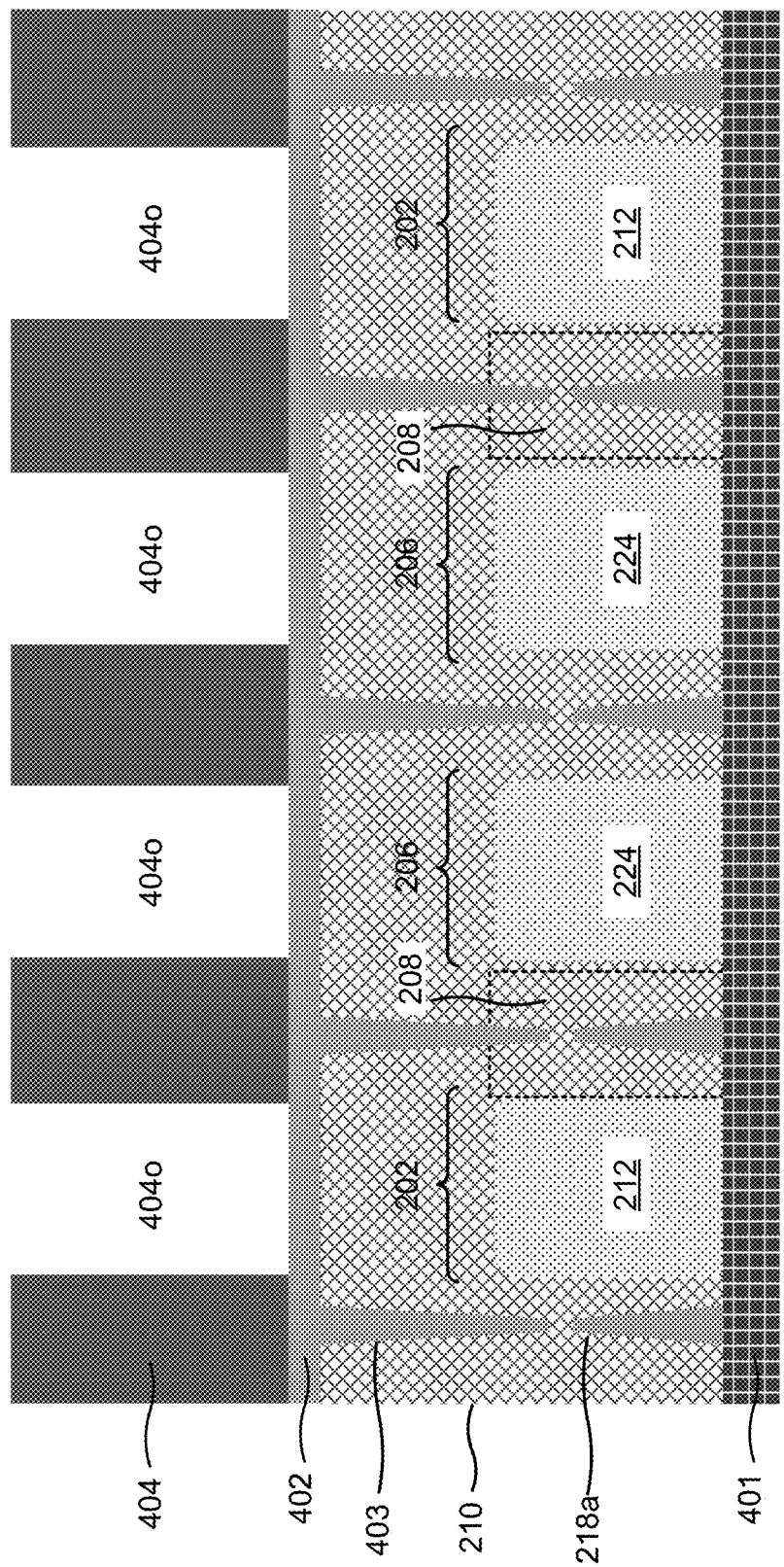

As shown in FIG. 5J, openings 404o may be formed in the plurality of layers to form the grid structure 404. The openings 404o may be formed over the photodiodes 212 of the ToF sensors 202 and the photodiodes 224 of the pixel sensors 206 such that color filter regions may be filled in the openings 404o. In some implementations, the openings 404o and the grid structure 404 are formed using a photoresist (e.g., deposited by the deposition tool 102), where a pattern in the photoresist is formed by exposing the photoresist to a radiation source (e.g., using the exposure tool 104) and removing either the exposed portions or the non-exposed portions of the photoresist (e.g., using developer tool 106). Here, the etch tool 108 etches the openings 404o through the one or more layers associated with the grid structure 404 based on the patterned photoresist.

Figure 5K:
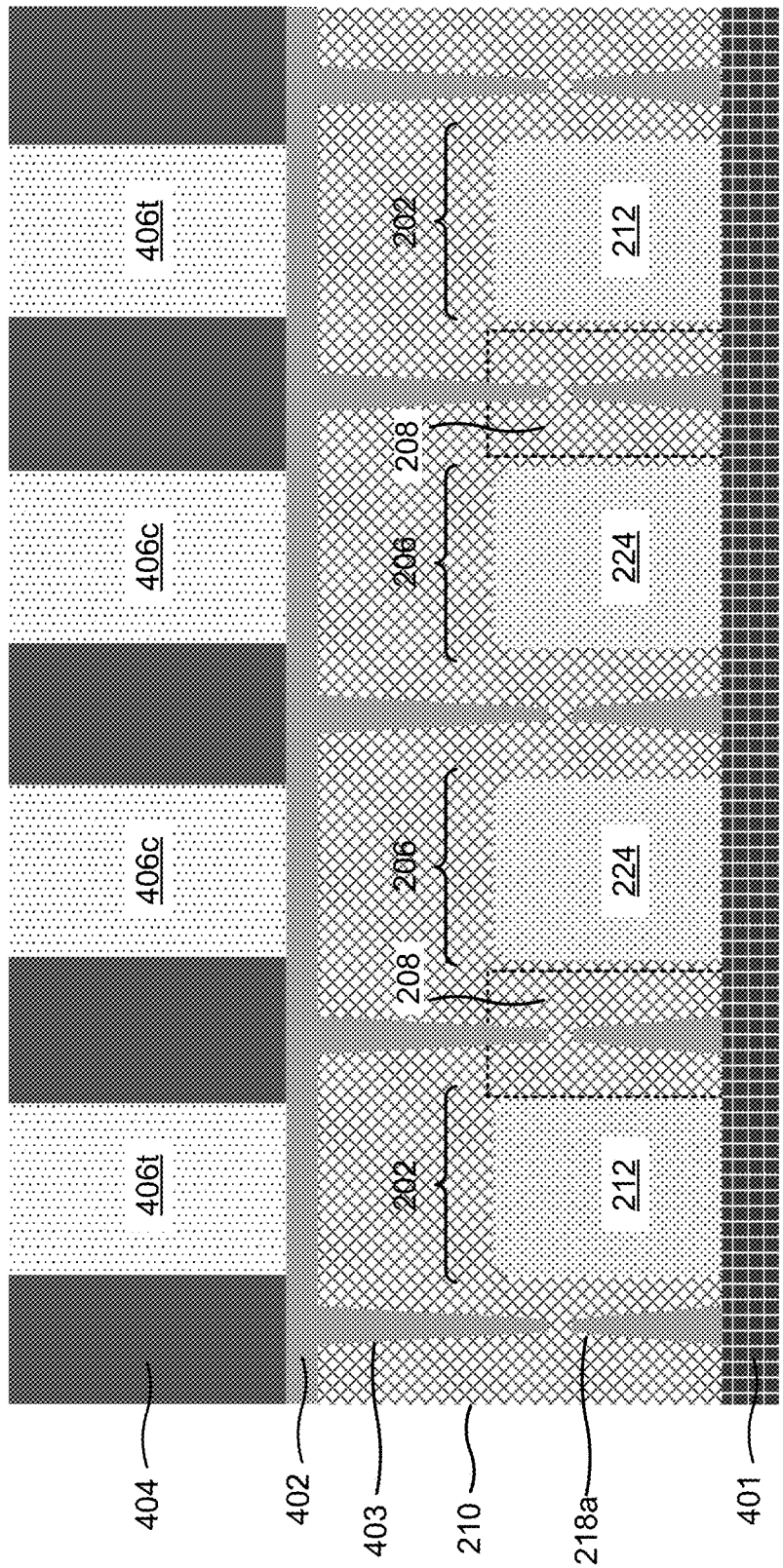

As shown in FIG. 5K, respective color filter regions 406 may be formed for each of the ToF sensors 202 and pixel sensors 206 in the pixel array 400 in the openings 404o. Each color filter region 406 may be formed in between the grid structure 404 to reduce color mixing between adjacent pixel sensors 206. A semiconductor processing tool (e.g., the deposition tool 102) may deposit the color filter regions 406 using various PVD techniques, CVD techniques and/or ALD techniques, such as sputtering, PECVD, HDP-CVD, SACVD, or PEALD.

Figure 5L:
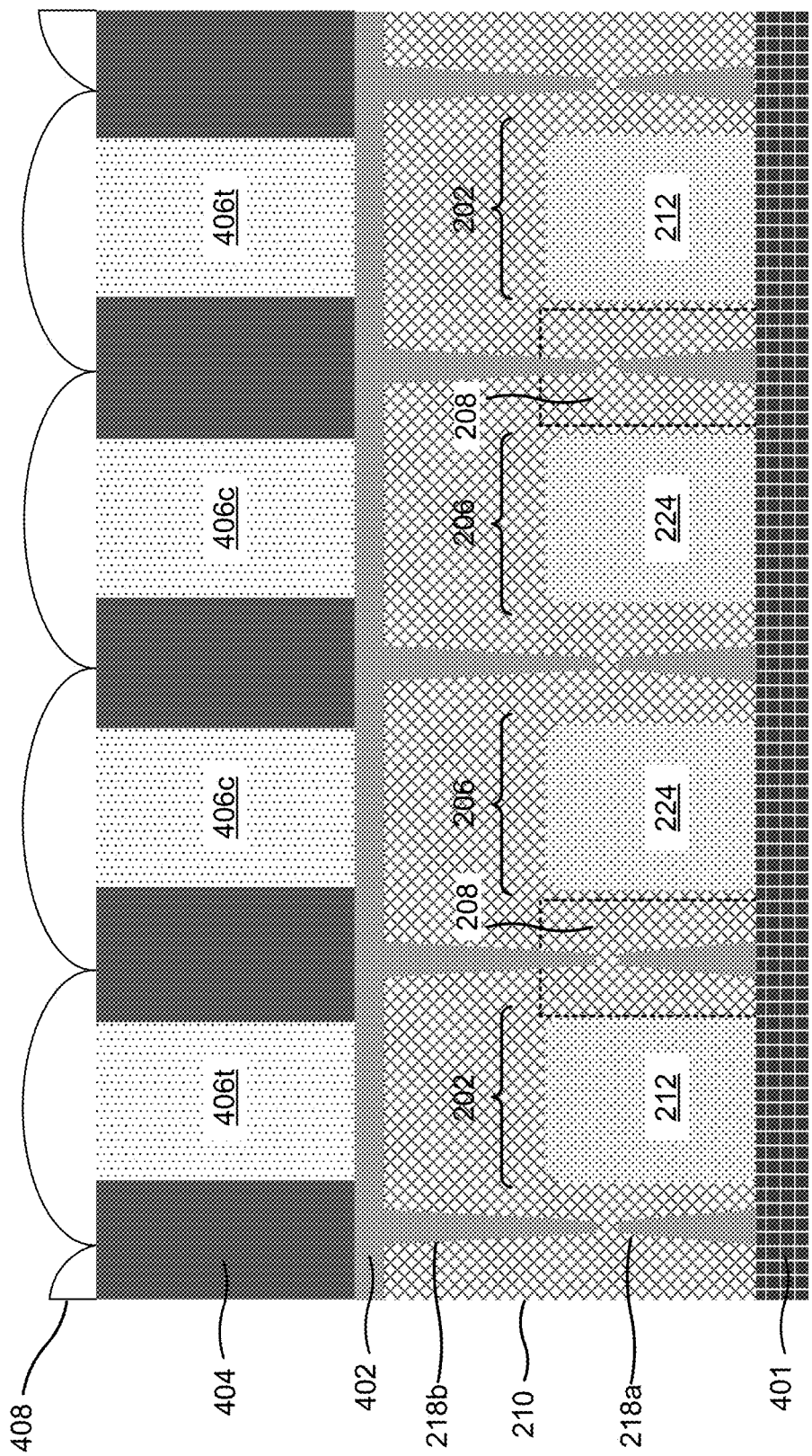

As shown in FIG. 5L, the micro-lens layer 408 including a plurality of micro-lenses is formed over and/or on the color filter regions 406. The micro-lens layer 408 may include a respective micro-lens for each of the ToF sensors 202 and each of the pixel sensors 206 included in the pixel array 400.

As indicated above, FIGS. 5A-5L are provided as an example. Other examples may differ from what is described with regard to FIGS. 5A-5L.

Figure 6A:
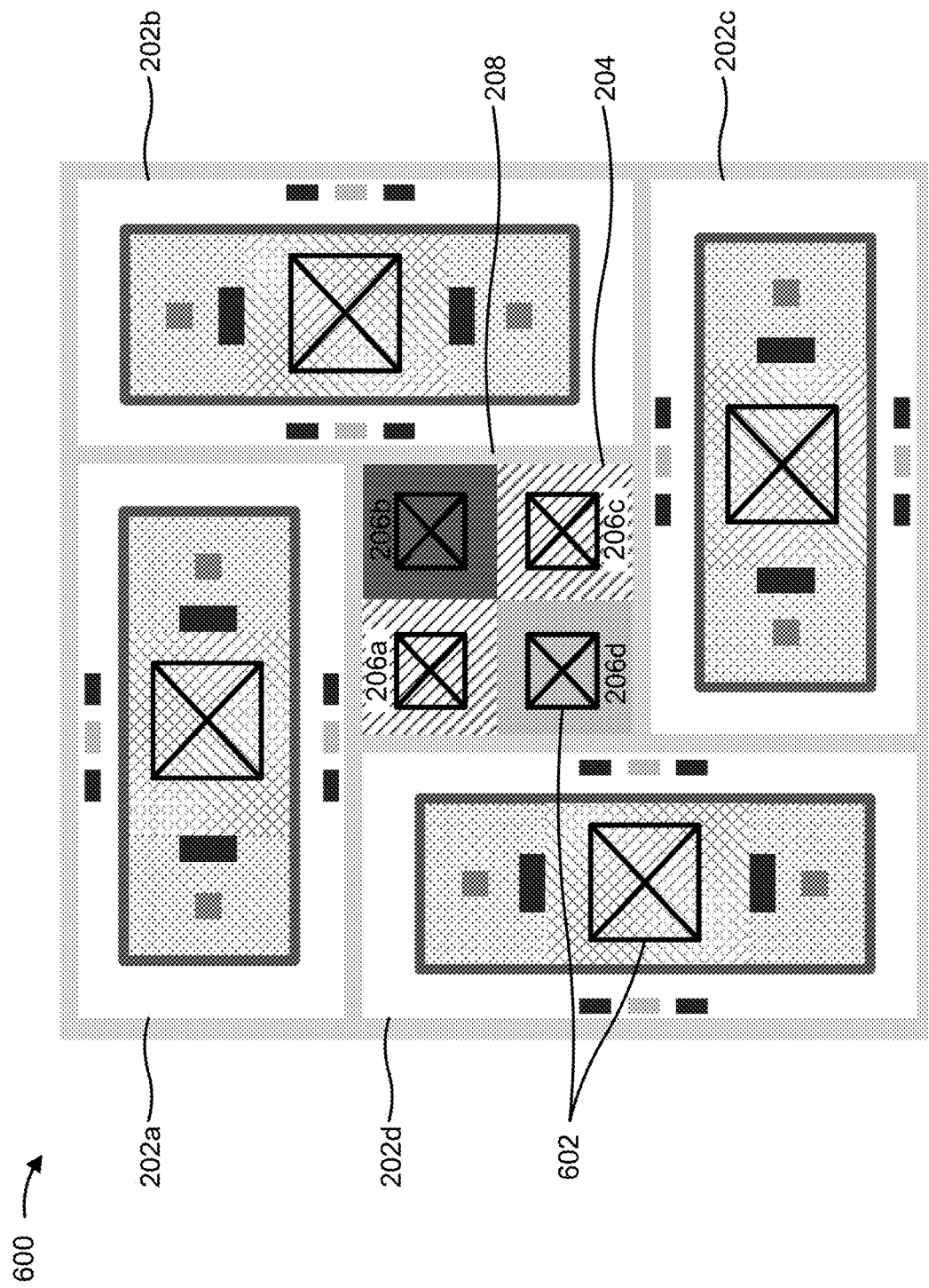
FIGS. 6A and 6B are diagrams of an example pixel array described herein.
Figure 6B:
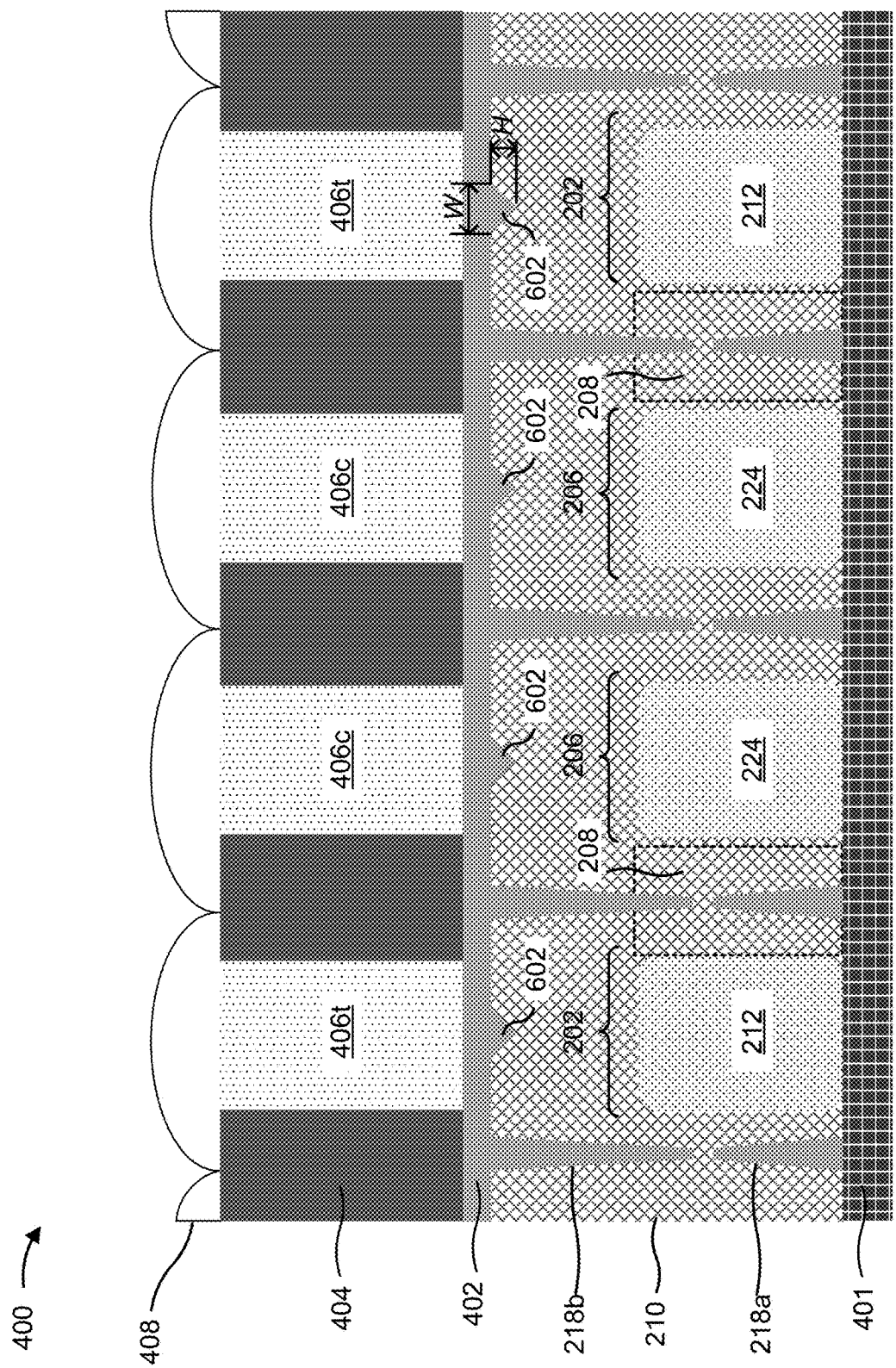

In some implementations, one or more pixel sensors 206 in a group of pixel sensors 206 and/or one or more ToF sensors 202 in a group of ToF sensors 202 of a pixel array 200 may include respective high absorption regions. FIGS. 6A and 6B are diagrams of example pixel arrays in which pixel sensors 206 and ToF sensors 202 include respective high absorption regions. FIG. 6A is a diagram of a top view of an example pixel array 600 having the first example layout in which pixel sensors 206 and ToF sensors 202 include respective high absorption regions 602. FIG. 6B is an example cross-sectional view of a pixel array 400 in which pixel sensors 206 and ToF sensors 202 include respective high absorption regions 602.

A high absorption region 602 may increase the absorption of incident light for a ToF sensor 202/pixel sensor 206 (thereby increasing the quantum efficiency (QE) of the ToF sensor 202/pixel sensor 206) by modifying or changing the orientation of the refractive interface between the oxide layer 402 of the photodiode 212/photodiode 224 and the oxide layer 402. A high absorption region 602 may include a structure having angled walls such that the structure is approximately triangular shaped. The angled walls of the high absorption region 602 may be angled relative to the top surface of the substrate 210, and may be angled inward toward a photodiode 212/photodiode 224. Thus, the angled walls change the orientation of the interface by causing the interface to be diagonal relative to the orientation of the top surface of the substrate 210. This change in orientation may result in a change in refraction relative to the flat surface of the top layer of the substrate 210 for the same angle of incidence of incident light. For example, increasing the inward angle of the angled walls relative to the top surface of the substrate 210 may decrease reflections of incident light traveling at a high angle of incidence relative to the top surface of the substrate 210 because the increased inward angle decreases the angle of incidence of the incident light relative to the angled walls of the high absorption region 602. As a result, the high absorption region 602 is capable of directing wider angles of incident light toward the center of the photodiode 212/photodiode 224 than if no high absorption region 602 were included in the pixel sensor 206. In some implementations, the high absorption region 602 can improve QE, increase intensity of light received by a given sensor of pixel array 200 (e.g., by increasing an amount of light directed to the photodiode 212/photodiode 224), and increase a pixel area of a given sensor of the pixel array 200, thereby improving resolution achieved by the sensors of the pixel array 200.

In some implementations, all of the ToF sensors 202 and pixel sensors 206 of the pixel array 200 include a high absorption region 602. In some implementations, a subset of the ToF sensors 202 and the pixel sensors 206 of the pixel array 200 include a high absorption region 602. In some implementations, all of a particular type of pixel sensor 206 (e.g., a red pixel sensor, a green pixel sensor, a blue pixel sensor, a ToF sensor 202, among other examples) of the pixel array 200 include a high absorption region 602. In some implementations, a first subset of a particular type of pixel sensor 206 of the pixel array 200 includes a high absorption region 602, and a high absorption region 602 is omitted from a second subset of the particular type of pixel sensor 206 of the pixel array 200. High absorption regions 602 may be included in or excluded from the pixel sensors 206 of the pixel array 200 based on various factors, such as a target quantum efficiency for the pixel sensors 206, the intended application or use case for the pixel array 200, or the like. For example, high absorption regions 602 might be included in the pixel sensors 206 of the pixel array 200 to achieve a high target quantum efficiency, or may be excluded from the pixel sensors 206 if a lower target quantum efficiency is specified. As another example, high absorption regions 602 might be included in the pixel sensors 206 of the pixel array 200 if the intended application or use case for the pixel array 200 involves a large amount of expected off-angle or wide-angle incident light, or may be excluded from the pixel sensors 206 if the intended application or use case for the pixel array 200 primarily involves coherent or narrow-angle incident light (e.g., such as light emitted from a laser).

As shown in FIG. 6B, a high absorption region 602 may be formed in the substrate 210 and may extend into a respective photodiode 212 of a ToF sensor 202 or a respective photodiode 224 of a pixel sensor 206. For example, the substrate 210 may be patterned with a photoresist, and the photodiode region of a pixel sensor 206 may be etched based on the pattern in the photoresist to form a high absorption region 602 for the pixel sensor 206. The high absorption region 602 may be filled with the oxide material of the oxide layer 402 during deposition of the oxide layer 402.

In some implementations, the high absorption regions 602 for a plurality of ToF sensors 202 and/or pixel sensors 206 may be the same size. For example, the high absorption regions 602 for a plurality of ToF sensor 202 and/or pixel sensors 206 may have the same height H. In some implementations, the high absorption regions 602 for the plurality of ToF sensor 202 and/or pixel sensors 206 may be different sizes. For example, the high absorption regions 602 for one or more ToF sensors 202 may have a different height H than the high absorption regions 602 for one or more pixel sensors 206. In some implementations, the height H for the high absorption regions 602 for ToF sensors 202, or for pixel sensors 206 of a particular type, may be the same height. In some implementations, the height H for the high absorption regions 602 for ToF sensors 202, or for pixel sensors 206 of a particular type, may be different.

In some implementations, the height H for the high absorption regions 602 for a first type of sensor in the pixel array 200 (e.g., ToF sensor 202, a particular type of pixel sensor 206) may be greater relative to the height H for high absorption regions 602 for a second type of sensor in the pixel array 200. In some implementations, the height H for the high absorption region 602 may be based on a wavelength of incident light that is to be sensed or absorbed by the pixel sensor 206. For example, the height H for the high absorption regions 602 included in the pixel array 200 may be increased as the wavelength of incident light that is to be sensed or absorbed increases, and may be decreased as the wavelength of incident light that is to be sensed or absorbed decreases. This is because increasing the height of a high absorption region 602 results in larger (longer) angled walls that can better accommodate longer wavelengths of light, whereas decreasing the height of a high absorption region 602 provides relatively smaller (shorter) angled walls for shorter wavelengths of light.

As an example, the height H for the high absorption regions 602 included in blue pixel sensors of the pixel array 200 may be the smallest height (e.g., because blue light is the shortest wavelength). The height H for the high absorption regions 602 included in green pixel sensors of the pixel array 200 may be larger than the height H for the high absorption regions 602 included in the blue pixel sensors (e.g., because the wavelength of green light is greater than the wavelength of blue light). The height H for the high absorption regions 602 included in red pixel sensors of the pixel array 200 may be larger than the height H for the high absorption regions 602 included in the green pixel sensors and the blue pixel sensors (e.g., because the wavelength of red light is greater than the wavelength of green light, and the wavelength of blue light). The height H for the high absorption regions 602 included in ToF sensors 202 of the pixel array 200 may be larger than the height H for the high absorption regions 602 included in the red pixel sensors, the green pixel sensors, and the blue pixel sensors (e.g., because wavelengths of light to be received by the ToF sensor 202 is greater than the wavelength of red light, the wavelength of green light, and the wavelength of blue light).

In some implementations, the width W of a high absorption region 602 may scale proportionally with the height H of the high absorption region 602 to ensure that the angle of the angled walls of the high absorption region 602 stays constant. In these examples, the width W of a high absorption region 602 may increase proportionally with an increase in height H of the high absorption region 602, or may decrease proportionally with a decrease in height H to ensure that the angle of the angled walls of the high absorption region 602 stays constant.

As indicated above, FIGS. 6A and 6B are provided as examples. Other examples may differ from what is described with regard to FIGS. 6A and 6B.

Figure 7:
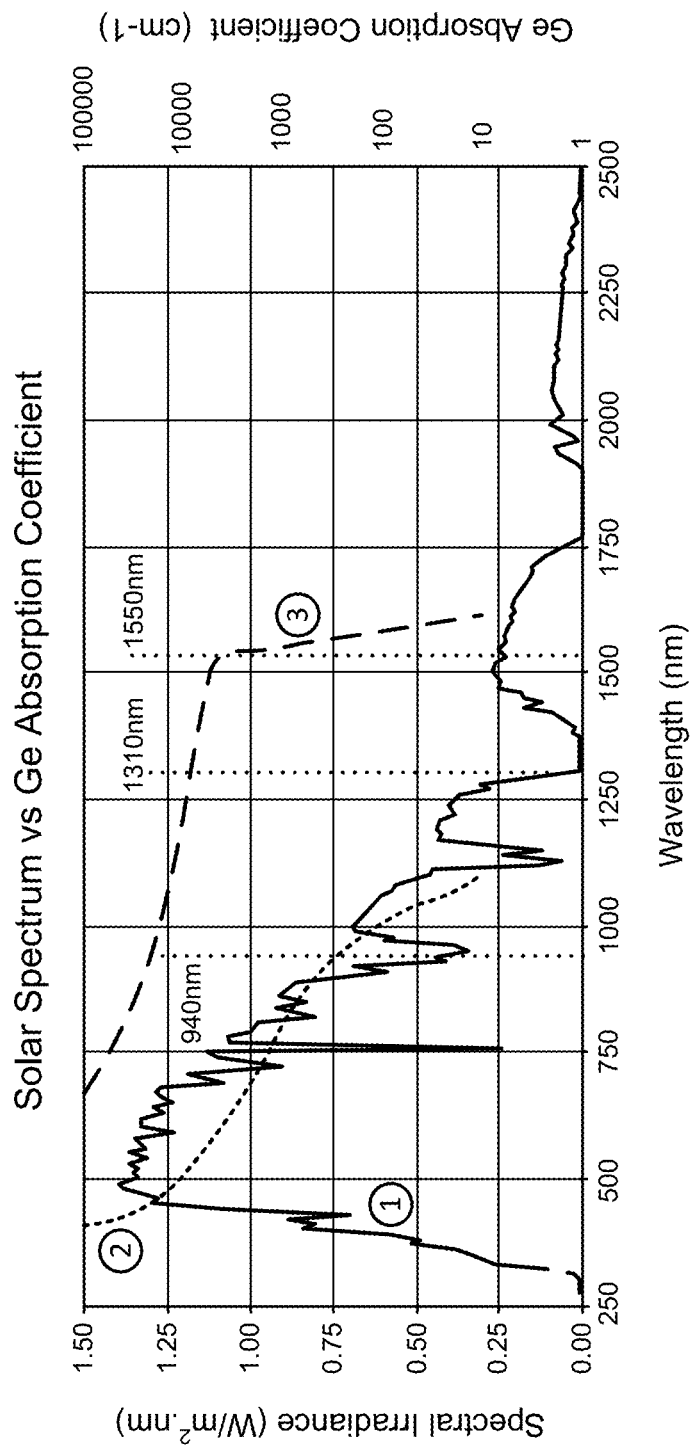
FIG. 7 is a diagram of absorption data described herein.

FIG. 7 is a diagram illustrating absorption data associated with materials in which ToF sensors 202 and pixel sensors 206 described herein can be formed. The lines labeled "1" and "2" in FIG. 7 represent absorption rates of silicon and a silicon-based material used in a CMOS image sensor, respectively. The line labeled "3" in FIG. 7 represents an absorption rate of SiGe. As shown in FIG. 7, the absorption rates of silicon and the silicon-based material used in the CMOS sensor decrease more rapidly with increasing wavelength as compared to the absorption rate of SiGe. Notably, the absorption rate of SiGe remains relatively high up to approximately 1550 nm, after which the absorption rate decreases. Due to the characteristics of SiGe, in some implementations, ToF sensors 202 can utilize a light source with a wavelength of approximately 1550 nm or higher. As such, SiGe is suitable for ToF sensing in low light conditions (e.g., at night) because SiGe absorbs invisible light (e.g., light having a wavelength greater than approximately 740 nm) better than silicon and a silicon-based material.

As indicated above, FIG. 7 is provided as an example. Other examples may differ from what is described with regard to FIG. 7.

Figure 8:
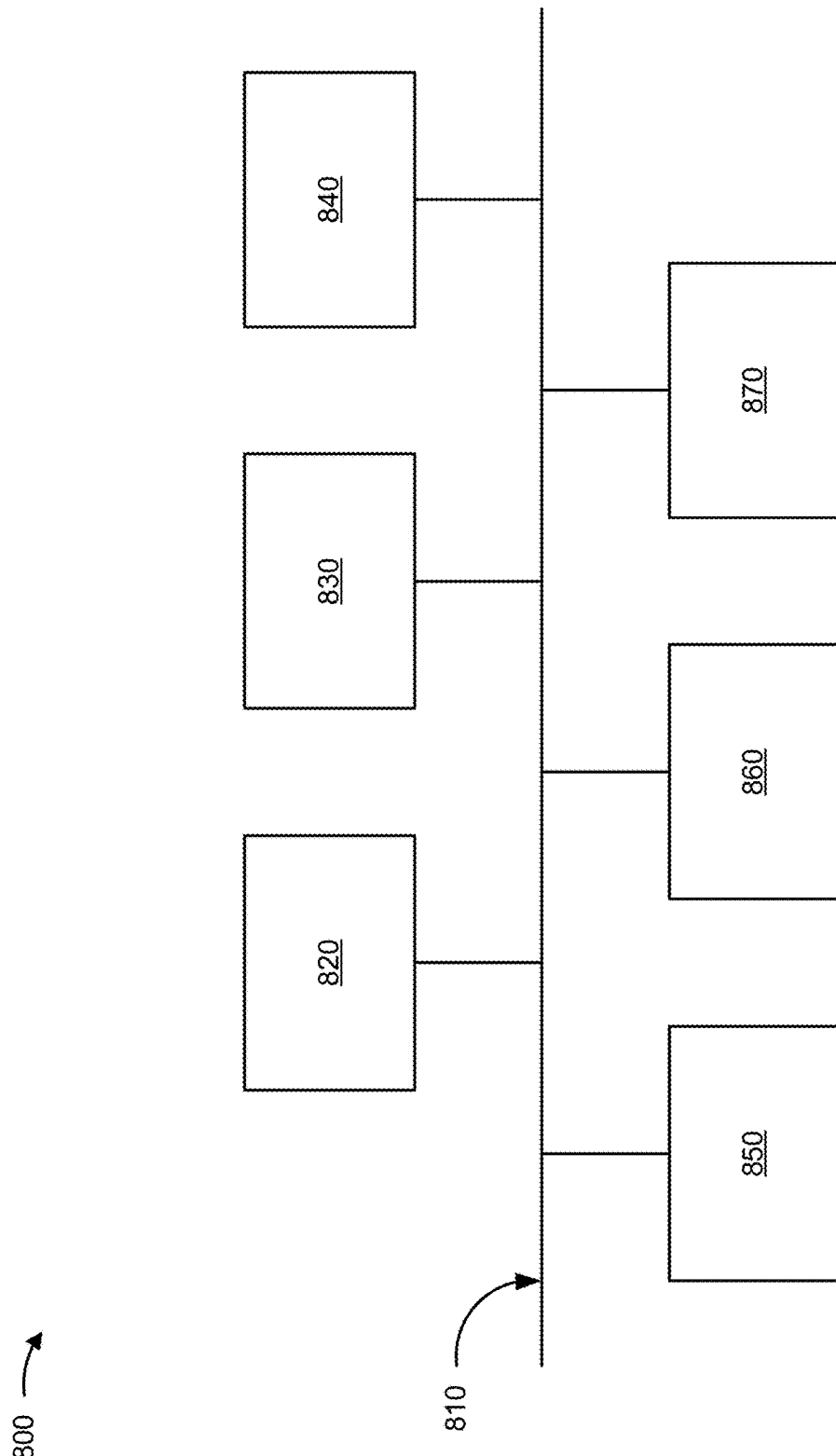
FIG. 8 is a diagram of example components of one or more devices of FIG. 1.

FIG. 8 is a diagram of example components of a device 800. In some implementations, one or more of the semiconductor processing tools 102-112 and/or the wafer/die transport tool 114 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
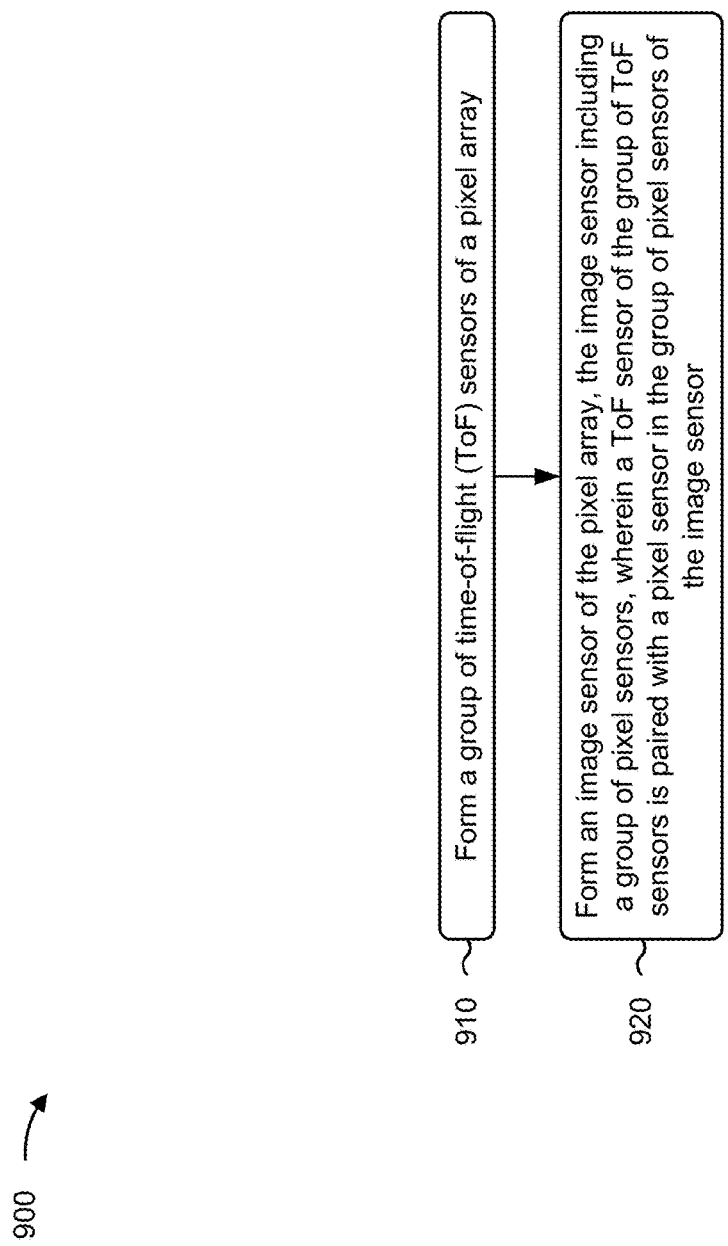
FIG. 9 is a flowchart of an example process relating to forming a pixel array.

FIG. 9 is a flowchart of an example process 900 associated with forming a pixel array. In some implementations, one or more process blocks of FIG. 9 may be performed by one or more semiconductor processing tools (e.g., one or more of the semiconductor processing tools 102-112). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming a group of ToF sensors of a pixel array (block 910). For example, the one or more semiconductor processing tools 102-112 may form a group of ToF sensors (e.g., a group of ToF sensors 202) of a pixel array (e.g., a pixel array 200, 300, 310, or 320), as described above.

As further shown in FIG. 9, process 900 may include forming an image sensor of the pixel array, the image sensor including a group of pixel sensors, wherein a ToF sensor of the group of ToF sensors is paired with a pixel sensor in the group of pixel sensors of the image sensor (block 920). For example, the one or more semiconductor processing tools 102-112 may form an image sensor (e.g., image sensor 204) of the pixel array, the image sensor including a group of pixel sensors (e.g., a group of pixel sensors 206), as described above. In some implementations, a ToF sensor of the group of ToF sensors is paired with a pixel sensor in the group of pixel sensors of the image sensor.

Process 900 may include additional implementations, such as any single implementation or any combination of implementations described below and/or in connection with one or more other processes described elsewhere herein.

In a first implementation, process 900 includes forming respective high absorption regions (e.g., respective high absorption regions 602) in at least one pixel sensor of the group of pixel sensors and at least one ToF sensor of the group of ToF sensors.

In a second implementation, alone or in combination with the first implementation, the image sensor is surrounded by the group of ToF sensors such that at least one ToF sensor of the group of ToF sensors is between the image sensor and another image sensor (e.g., another image sensor 204) of the pixel array.

In a third implementation, alone or in combination with one or more of the first and second implementations, the ToF sensor is paired with another pixel sensor (e.g., another pixel sensor 206), the other pixel sensor being included in a group of pixel sensors of another image sensor (e.g., another image sensor 204).

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a pixel array may include a plurality of ToF sensors and a plurality of image sensors (e.g., a plurality of CMOS image sensors, such as a plurality of RGB image sensors). Here, outputs of the plurality of ToF sensors and the plurality of image sensors may be used to generate a 3D ToF color image (rather than a distance image or a color image), which may be useful in, for example, 3D module construction, and which can be used in a variety of applications, such as a medical application, a VR application, an AR application, a 3D printing application, or an autonomous vehicle application, among other examples.

As described in greater detail above, some implementations described herein provide a pixel array. The pixel array includes a group of ToF sensors. The pixel array includes an image sensor comprising a group of pixel sensors, where the image sensor is arranged among the group of ToF sensors such that the image sensor is adjacent to each ToF sensor in the group of ToF sensors.

As described in greater detail above, some implementations described herein provide a pixel array. The pixel array includes a plurality of ToF sensors. The pixel array includes a plurality of image sensors, each of the plurality of image sensors comprising a respective group of pixel sensors, where an image sensor of the plurality of image sensors is arranged between a subset of ToF sensors of the plurality of ToF sensors, and where each pixel sensor in a group of pixel sensors of the image sensor and each ToF sensor in the subset of ToF sensors include respective high absorption regions.

As described in greater detail above, some implementations described herein provide a method. The method includes forming a group of ToF sensors of a pixel array. The method includes forming an image sensor of the pixel array, the image sensor including a group of pixel sensors, where a ToF sensor of the group of ToF sensors is paired with a pixel sensor in the group of pixel sensors of the image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
a plurality of rectangular time-of-flight (ToF) sensors; and
an image sensor comprising a plurality of pixel sensors
  each having one side contacting another side of another pixel sensor of the plurality of pixel sensors,
  wherein, in a top view of the pixel array:
    the plurality of rectangular ToF sensors completely surround the image sensor,
    each of the plurality of rectangular ToF sensors comprises a photodiode spaced away from the image sensor, and
    each of the plurality of rectangular ToF sensors contacts two pixel sensors of the plurality of pixel sensors of the image sensor, wherein the two pixel sensors are in contact with each other.

2. The pixel array of claim 1, wherein a first set of rectangular ToF sensors in the plurality of rectangular ToF sensors is oriented in a first direction and a second set of rectangular ToF sensors in the plurality of rectangular ToF sensors is oriented in a second direction that is different from the first direction.

3. The pixel array of claim 1, wherein each rectangular ToF sensor in the plurality of rectangular ToF sensors is oriented in a same direction.

4. The pixel array of claim 1, wherein each pixel sensor in the plurality of pixel sensors and each rectangular ToF sensor in the plurality of rectangular ToF sensors include respective high absorption regions.

5. The pixel array of claim 1, wherein an output of a particular rectangular ToF sensor of the plurality of rectangular ToF sensors is to be used in conjunction with an output of a particular pixel sensor of the plurality of pixel sensors.

6. The pixel array of claim 1, wherein the image sensor is separated from each rectangular ToF sensor of the plurality of rectangular ToF sensors by a respective isolation region.

7. A pixel array, comprising:
a plurality of rectangular time-of-flight (ToF) sensors; and
a plurality of image sensors, each of the plurality of image sensors comprising a respective plurality of pixel sensors each having one side contacting another side of another pixel sensor of the respective plurality of pixel sensors,
  wherein, in a top view of the pixel array:

an image sensor in the plurality of image sensors is completely surrounded by a subset of rectangular ToF sensors of the plurality of rectangular ToF sensors, the image sensor is spaced a distance away from a photodiode of each rectangular ToF sensor in the subset of rectangular ToF sensors contacts, and two pixel sensors in the respective plurality of pixel sensors of the image sensor are in contact with each other and further in contact with two rectangular ToF sensors in the plurality of rectangular ToF sensors, and wherein each pixel sensor in the respective plurality of pixel sensors of the image sensor and each rectangular ToF sensor in the subset of rectangular ToF sensors include respective high absorption regions.

8. The pixel array of claim 7, wherein the image sensor is centered in the subset of rectangular ToF sensors.

9. The pixel array of claim 7, wherein the subset of rectangular ToF sensors is a first subset of rectangular ToF sensors and the image sensor is a first image sensor, wherein a second subset of rectangular ToF sensors of the plurality of rectangular ToF sensors surrounds a second image sensor of the plurality of image sensors such that the second image sensor is centered in the second subset of rectangular ToF sensors, and wherein a particular rectangular ToF sensor is included in both the first subset of rectangular ToF sensors and the second subset of rectangular ToF sensors.

10. The pixel array of claim 7, wherein one or more rectangular ToF sensors of the plurality of rectangular ToF sensors are oriented perpendicular relative to one or more other rectangular ToF sensors in the plurality of rectangular ToF sensors.

11. The pixel array of claim 7, wherein each rectangular ToF sensor in the plurality of rectangular ToF sensors is oriented parallel to each other rectangular ToF sensor in the plurality of rectangular ToF sensors.

12. The pixel array of claim 7, wherein an output of a rectangular ToF sensor of the subset of rectangular ToF sensors is to be used in conjunction with an output of a pixel sensor in the respective plurality of pixel sensors of the image sensor.

13. The pixel array of claim 7, wherein a quantity of rectangular ToF sensors in the plurality of rectangular ToF sensors is greater than a quantity of image sensors in the plurality of image sensors.

14. The pixel array of claim 7, wherein a quantity of rectangular ToF sensors in the plurality of rectangular ToF sensors matches a quantity of image sensors in the plurality of image sensors.

15. The pixel array of claim 1, wherein the image sensor is centered in the plurality of rectangular ToF sensors.

16. The pixel array of claim 1, wherein each of the two pixel sensors contacts two rectangular TOFs of the plurality of rectangular TOFs.

* * * * *